United States Patent
Fujimoto et al.

(10) Patent No.: US 10,291,198 B2
(45) Date of Patent: May 14, 2019

(54) MATCHING DEVICE AND MATCHING METHOD

(71) Applicant: HITACHI KOKUSAI ELECTRIC INC., Tokyo (JP)

(72) Inventors: Naoya Fujimoto, Tokyo (JP); Yoshiyuki Oshida, Tokyo (JP); Norikazu Kato, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 76 days.

(21) Appl. No.: 15/553,334

(22) PCT Filed: Feb. 8, 2016

(86) PCT No.: PCT/JP2016/053676
§ 371 (c)(1),
(2) Date: Aug. 24, 2017

(87) PCT Pub. No.: WO2016/136444
PCT Pub. Date: Sep. 1, 2016

(65) Prior Publication Data
US 2018/0115298 A1 Apr. 26, 2018

(30) Foreign Application Priority Data

Feb. 27, 2015 (JP) .................. 2015-038531

(51) Int. Cl.
*H03H 7/38* (2006.01)
*H03H 7/40* (2006.01)
(Continued)

(52) U.S. Cl.
CPC ....... *H03H 7/383* (2013.01); *H01J 37/32183* (2013.01); *H01P 5/18* (2013.01);
(Continued)

(58) Field of Classification Search
CPC .................. H03H 7/38; H03H 7/40
(Continued)

(56) References Cited

U.S. PATENT DOCUMENTS

2010/0225411 A1  9/2010  Maier
2015/0236728 A1  8/2015  Suzuki
2016/0141882 A1  5/2016  Ichikawa

FOREIGN PATENT DOCUMENTS

JP  2001-274651 A  10/2001
JP  2012-130061 A  7/2012
(Continued)

OTHER PUBLICATIONS

Korean Office Action dated Aug. 21, 2018 issued in corresponding Korean Patent Application No. 10-2017-7023780 and English translation thereof.
(Continued)

*Primary Examiner* — Stephen E. Jones
(74) *Attorney, Agent, or Firm* — Bacon & Thomas, PLLC

(57) ABSTRACT

A matching device includes: a directional coupler that detects a traveling wave and a reflected wave; a matching circuit that has a first variable capacitance capacitor, a second variable capacitance capacitor and an inductance; and a control unit that calculates a reflection coefficient based on the traveling wave and the reflected wave and controls a capacitance value VC1 of the first variable capacitance capacitor and a capacitance value VC2 of the second variable capacitance capacitor. The control unit changes VC2 such that VC2 moves toward a circle drawn by the trajectory of the reflection coefficient passing through a matching point on a Smith chart, fine-tunes VC1 on the basis of a predicted intersection point with the circle, and when the distance between the calculated reflection coefficient and the circle becomes a predetermined value or less, changes
(Continued)

VC1 such that the calculated reflection coefficient approaches zero, and fine-tunes VC2.

5 Claims, 16 Drawing Sheets

(51) Int. Cl.
    *H03H 11/30*     (2006.01)
    *H01J 37/32*     (2006.01)
    *H01P 5/18*     (2006.01)
    *H05H 1/46*     (2006.01)

(52) U.S. Cl.
    CPC .............. *H03H 7/40* (2013.01); *H03H 11/30* (2013.01); *H05H 2001/4682* (2013.01)

(58) Field of Classification Search
    USPC .................................................. 333/17.3, 32
    See application file for complete search history.

(56) References Cited

FOREIGN PATENT DOCUMENTS

| | | |
|---|---|---|
| WO | 2014/037994 A1 | 3/2014 |
| WO | 2014/203346 A1 | 12/2014 |

OTHER PUBLICATIONS

International Search Report dated Mar. 22, 2016 and English translation.

MATCHING DEVICE AND MATCHING METHOD

FIELD OF THE INVENTION

The present invention relates to a matching device for matching an output of a RF (Radio Frequency) generator and a load.

BACKGROUND OF THE INVENTION

A plasma processing apparatus is used in a semiconductor manufacturing process for performing etching or thin film formation. As for a power supply source of the plasma processing apparatus, a RF generator is used. In order to efficiently supply power from the RF generator to the plasma processing apparatus, it is required to match an impedance between the RF generator and the plasma processing apparatus (load). Generally, a matching device is interposed, as a unit for matching an impedance, between the RF generator and the plasma processing apparatus as described in, e.g., Patent Document 1.

FIG. 7 is a functional block diagram of a conventional matching device 100. Referring to FIG. 7, the matching device 100 is interposed between a RF generator 2 and a plasma processing apparatus 3. A plasma is generated by the plasma processing apparatus 3 by supplying a high frequency power outputted from the RF generator 2 to the plasma processing apparatus 3 through the matching device 100. In order to efficiently supply the power from the RF generator 2 to the plasma processing apparatus 3, it is required to match an impedance between the RF generator 2 and the plasma processing apparatus 3. An output impedance of the RF generator 2 is generally 50Ω. Therefore, it is preferable to set an input impedance of the matching device 100 to 50Ω by converting an input impedance of the plasma processing apparatus 3 using the matching device 100.

The input impedance of the plasma processing apparatus 3 varies depending on types, flow rates, pressures and temperatures of gases to be supplied to the plasma processing apparatus 3. Therefore, the matching device 100 needs to perform adaptive matching in response to the temporally varying input impedance of the plasma processing apparatus 3.

The matching device 100 shown in FIG. 7 includes a directional coupler 11 for detecting a travelling wave and a reflected wave, a matching circuit 30 having a matching element for matching an impedance between the RF generator 2 and the plasma processing apparatus 3, and a control unit 120 for controlling a circuit constant of the matching element of the matching circuit 30.

Hereinafter, an operation of the directional coupler 11 will be described. A high frequency power (travelling wave: Pf) travelling from an $RF_{in}$ terminal toward an $RF_{out}$ terminal is detected by the directional coupler 11 and outputted to a FORWARD terminal. A high frequency power (reflected wave: Pr) travelling from the $RF_{out}$ terminal toward the $RF_{in}$ terminal is detected by the directional coupler 11 and outputted to a REFLECT terminal. The high frequency power Pf travelling from the $RF_{in}$ terminal toward the $RF_{out}$ terminal is not detected at the REFLECT terminal, or even if detected, the amount thereof is very small. Similarly, the high frequency power Pr travelling from the $RF_{out}$ terminal toward the $RF_{in}$ terminal is not detected at the FORWARD terminal, or even if detected, the amount thereof is very small.

The travelling wave Pf and the reflected wave Pr detected by the directional coupler 11 are inputted to a reflection coefficient calculation unit 21. A reflection coefficient Γ is defined from an amplitude ratio r of the reflected wave Pr to the travelling wave Pf and a phase difference θ therebetween, as in the following Eq. (1).

$$\Gamma = r \cdot \exp(j \cdot \theta) \quad (j\text{: imaginary unit}) \qquad \text{Eq. (1)}$$

Therefore, the reflection coefficient Γ can be obtained if the amplitude ratio r of the reflected wave Pr to the travelling wave Pf and the phase difference θ therebetween can be obtained. The reflection coefficient calculation unit 21 calculates the reflection coefficient Γ by obtaining the amplitude ratio r and the phase difference θ based on the travelling wave Pf and the reflected wave Pr. Specifically, the travelling wave Pf and the reflected wave Pr are transformed to a frequency domain by FFT (Fast Fourier Transform), and the amplitude ratio r and the phase difference θ are calculated by comparing the amplitudes and the phases of the travelling wave Pf and the reflected wave Pr at a frequency equal to that of the high frequency power outputted from the RF generator 2.

A capacitance calculation unit 122 calculates a capacitance of a capacitor which makes the reflection coefficient Γ close to zero based on the reflection coefficient Γ calculated by the reflection coefficient calculation unit 21. The calculation of the capacitance of the capacitor will be described later. A capacitance setting unit 23 sets and changes a capacitance of a variable capacitance capacitor in the matching circuit 30 based on the capacitance of the capacitor which is calculated by the capacitance calculation unit 122.

FIG. 2 is a block diagram of the matching circuit 30. A circuit configuration of the matching circuit 30 is determined by a variation range of the input impedance of the plasma processing apparatus 3 which acts as a load. In that case, a π-type matching circuit will be described as an example. The matching circuit 30 includes variable capacitance capacitors 31 and 32, an inductance 33, and transmission lines 35 and 36. The transmission lines 35 and 36 may be configured as coaxial cables, metal plates or the like and may include a lumped constant circuit of an inductor or a capacitor.

An input terminal 30a of the matching circuit 30 and one end of the variable capacitance capacitor 31 are connected through the transmission line 35. The other end of the variable capacitance capacitor 31 is grounded. An output terminal 30b of the matching circuit 30 and one end of the variable capacitance capacitor 32 are connected through the transmission line 36. The other end of the variable capacitance capacitor 32 is grounded.

The variable capacitance capacitors 31 and 32 and the inductance 33 serve as matching elements for matching an impedance between the RF generator 2 and the plasma processing apparatus 3. The matching circuit 30 further includes a variable capacitance capacitor control terminal 31a for controlling a capacitance of the variable capacitance capacitor 31 and a variable capacitance capacitor control terminal 32a for controlling a capacitance of the variable capacitance capacitor 32.

The variable capacitance capacitor of the matching circuit is controlled such that the reflection coefficient Γ calculated from the travelling wave Pf and the reflected wave Pr detected by the directional coupler 11 becomes close to zero. The variable capacitance at this time is calculated by the following Eqs. (2) and (3). VC1 indicates a capacitance of the variable capacitance capacitor 31. VC2 indicates a capacitance of the variable capacitance capacitor 32.

$$VC1(n)=VC1(n-1)+\text{real}(\Gamma(n))*S1 \quad \text{Eq. (2)}$$

$$VC2(n)=VC2(n-1)-\text{imag}(\Gamma(n))*S2 \quad \text{Eq. (3)}$$

Here, real( ) indicates a real part of a complex number in parentheses, and imag( ) indicates an imaginary part of a complex number in parentheses. S1 and S2 indicate coefficient and determine an update amount of the capacitance of the capacitor.

The above Eq. (2) is used for updating VC1. The above Eq. (3) is used for updating VC2. VC1(n) is calculated by adding a value obtained by multiplying the real part of the reflection coefficient $\Gamma$ by the coefficient S1 to a previously updated VC1(n−1). VC2(n) is calculated by subtracting a value obtained by multiplying the imaginary part of the reflection coefficient $\Gamma$ by the coefficient S2 from a previously updated VC2(n−1). Here, in VC1 and VC2, whether the update amount (real($\Gamma$)*S1 or imag($\Gamma$)*S2) is added or subtracted depends on the circuit type of the matching circuit 30 and the input impedance of the load to be matched.

The algorithm of such a conventional technique is disadvantageous in that VC1 and VC2 do not converge on a matching point when the load impedance changes. As described above, the impedance of the plasma load changes. The impedance of the plasma load changes abruptly before and after the ignition of the plasma and also changes depending on types, flow rates, pressures and temperatures of gases to be supplied to the plasma processing apparatus.

VC1 and VC2 for allowing the input impedance of the matching circuit 30 to be matched to 50Ω (i.e., for making the reflection coefficient zero) are determined by the load impedance connected to the output of the matching device 100. Since, however, the plasma load changes, VC1 and VC2 for the matching also change. Therefore, in the case of using the algorithm of the above Eqs. (2) and (3), VC1 and VC2 may not converge on the matching point. This is because VC1 is calculated by the above Eq. (2) and VC2 is calculated by the above Eq. (3). In other words, VC1 is calculated from the real part of the reflection coefficient and VC2 is calculated from the imaginary part of the reflection coefficient. However, the relations in the above Eqs. (2) and (3) may not be satisfied depending on the impedance of the plasma load or the capacitance of the variable capacitance capacitor. In that case, VC1 and VC2 do not converge on the matching point.

Patent document 1: PCT Publication No. WO2013/132591

SUMMARY OF THE INVENTION

As described above, in the matching algorithm of the conventional technique, there may be no converge on a matching point depending on the load impedance. In view of the above, the present invention provides a matching algorithm that converges on a matching point regardless of the load impedance.

In accordance with an aspect, there is provided a matching device including a representative configuration as follows. That is, the matching device includes: a directional coupler configured to detect a travelling wave and a reflected wave; a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to said one end of the first variable capacitance capacitor and the other end connected to said one end of the second variable capacitance capacitor; and a control unit configured to control a capacitance value of the first variable capacitance capacitor and a capacitance value of the second variable capacitance capacitor based on the travelling wave and the reflected wave detected by the directional coupler.

The control unit calculates a reflection coefficient based on the travelling wave and the reflected wave detected by the directional coupler, changes the capacitance of the second variable capacitance capacitor such that the capacitance of the second variable capacitance capacitor goes to a circle described by a trace of the reflection coefficient which passes through a matching point on a Smith chart, calculates and predicts an intersection point with the circle, and determines a direction of fine-tuning of the capacitance of the first variable capacitance capacitor based on the predicted intersection point (expected point on circumference).

The control unit fine-tunes the capacitance of the first variable capacitance capacitor such that the capacitance of the first variable capacitance capacitor is increased when an imaginary part of the expected point on circumference is negative and fine-tunes the capacitance of the first variable capacitance capacitor such that the capacitance of the first variable capacitance capacitor is decreased when the imaginary part of the expected point on circumference is positive.

The control unit changes the capacitance of the first variable capacitance capacitor such that the calculated reflection coefficient becomes close to zero when a distance between the calculated reflection coefficient and the circle becomes a predetermined value or less. The control unit fine-tunes the capacitance of the second variable capacitance capacitor such that the capacitance of the second variable capacitance capacitor is decreased in the case of outward deviation from the circle and fine-tunes the capacitance of the second variable capacitance capacitor such that the capacitance of the second variable capacitance capacitor is increased in the case of inward deviation from the circle.

With the above configuration, the matching algorithm of the preset invention can converge on the matching point regardless of the load impedance.

DETAILED DESCRIPTION OF THE EMBODIMENTS

First Embodiment

Figure 1:
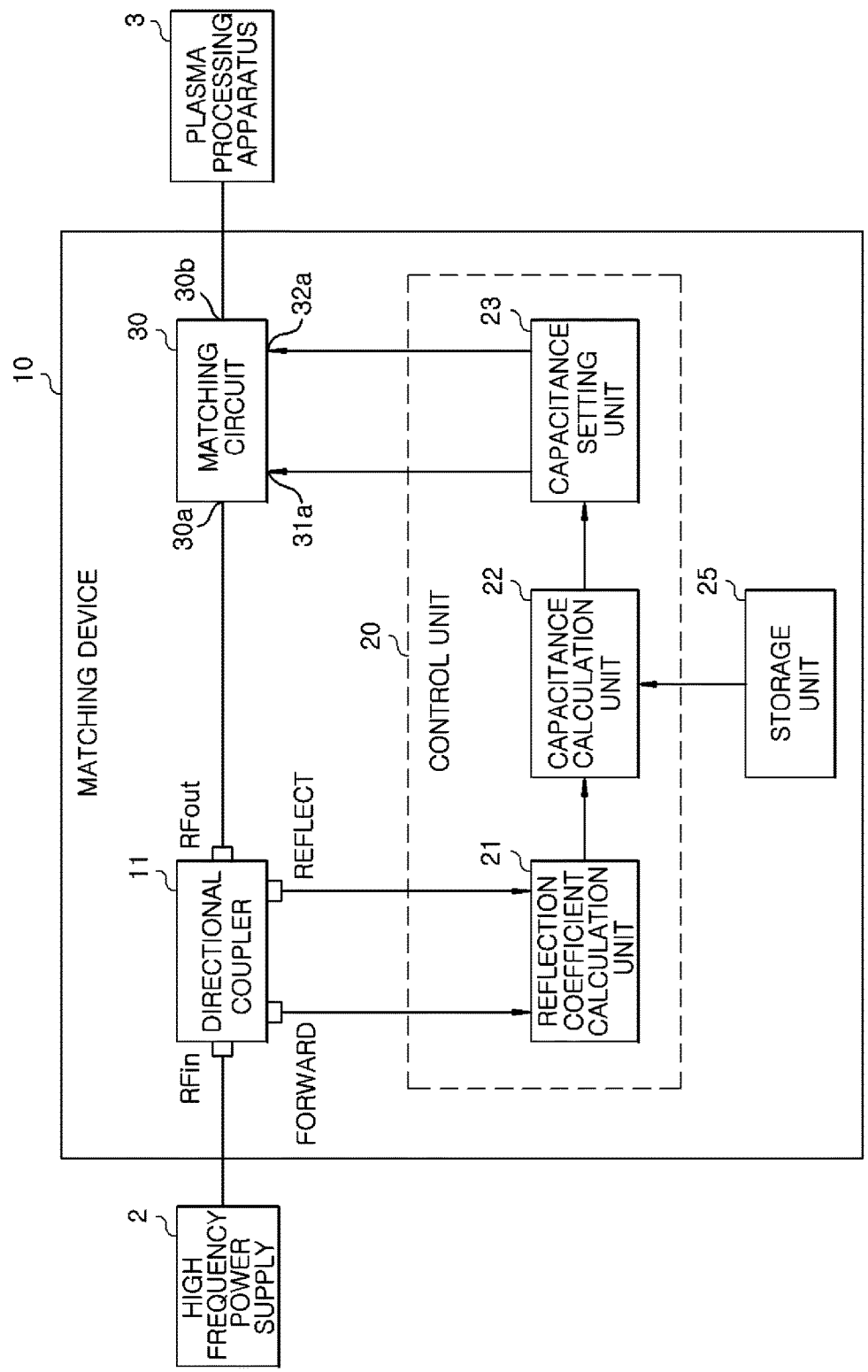
FIG. 1 is a block diagram of a matching device according to a first embodiment.
Figure 7:
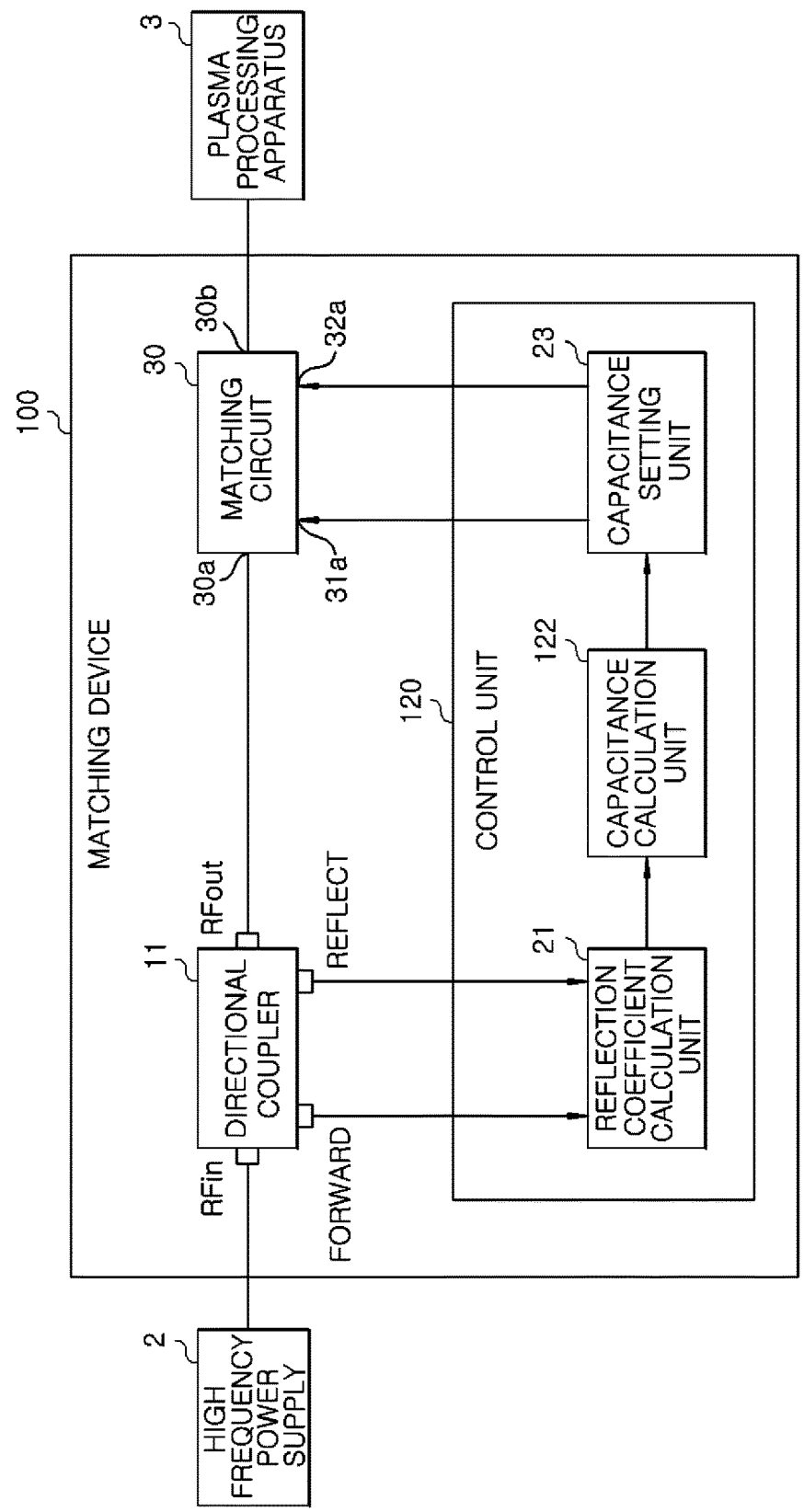
FIG. 7 is a block diagram of a conventional matching device.

Hereinafter, a first embodiment (embodiment 1) of the present invention will be described with reference to the accompanying drawings. FIG. 1 is a block diagram of a matching device 10 according to the first embodiment. Like reference numerals used in FIGS. 1 and 7 designate like parts, and redundant description thereof will be omitted.

The matching device 10 includes a directional coupler 11 for detecting a travelling wave and a reflected wave, a matching circuit 30 having a matching element for matching an impedance between a RF generator 2 and a plasma processing apparatus 3, a control unit 20 for controlling a circuit constant of the matching element of the matching device 10, and a storage unit 25.

As described above with reference to FIG. 2, the matching circuit 30 includes the input terminal 30a, the output terminal 30b, the first variable capacitance capacitor 31 having one end connected to the input terminal 30a through the transmission line 35 and the other end that is grounded, the second variable capacitance capacitor 32 having one end connected to the output terminal 30b through the transmission line 36 and the other end that is grounded, and the inductance 33 having one end connected to the one end of the first variable capacitance capacitor 31 and the other end connected to the one end of the second variable capacitance capacitor 32.

The control unit 20 includes the reflection coefficient calculation unit 21, the capacitance calculation unit 22, and the capacitance setting unit 23. As described above, the control unit 20 calculates a reflection coefficient based on the travelling wave and the reflected wave detected by the directional coupler 11 and controls a capacitance value of the first variable capacitance capacitor 31 and a capacitance value of the second variable capacitance capacitor 32 by using the calculated reflection coefficient. The storage unit 25 stores information on a circle or the like which will be described later. The matching device 10 is different from the conventional matching device 100 in the processing of the capacitance calculation unit 22, i.e., the control of the capacitance value VC1 of the variable capacitance capacitor 31 and the capacitance value VC2 of the variable capacitance capacitor 32 of the matching circuit 30. Further, the matching device 10 is different from the conventional matching device 100 in that the storage unit 25 for storing information on a circle is provided. The other configurations are the same as those of the conventional matching device 100.

The information on a circle is the information on a position or a size of a circle described by a trace of the reflection coefficient $\Gamma$ which passes through a matching point (where the real part and the imaginary part of the reflection coefficient $\Gamma$ are zero) on a Smith chart. It is known that the information on a circle is determined based on conditions of the transmission line 35, i.e., a characteristic impedance $Z_L$ and a line length L of the transmission line 35.

The capacitance calculation unit 22 calculates the capacitance values VC1 and VC2 of the variable capacitance capacitors 31 and 32 of the matching circuit 30 which correspond to the calculated reflection coefficient $\Gamma$ based on the information on a circle which is stored in the storage unit 25 and the reflection coefficient $\Gamma$ calculated by the reflection coefficient calculation unit 21. In other words, the capacitance calculation unit 22 calculates the capacitance values VC1 and VC2 that make the reflection coefficient $\Gamma$ smaller.

Specifically, the capacitance calculation unit 22 calculates the capacitance value VC2 of the variable capacitance capacitor 32 of the matching circuit 30 such that the reflection coefficient $\Gamma$ calculated by the reflection coefficient calculation unit 21 becomes close to the circle stored in the storage unit 25. The capacitance setting unit 23 changes the capacitance value VC2 of the variable capacitance capacitor 32 to the calculated capacitance value. Accordingly, the reflection coefficient $\Gamma$ is positioned on the circle by the capacitance setting unit 23.

Then, the capacitance calculation unit 22 calculates the capacitance value VC1 of the variable capacitance capacitor 31 of the matching circuit 30 such that the reflection coefficient $\Gamma$ calculated by the reflection coefficient calculation unit 21 becomes smaller. The capacitance setting unit 23 changes the capacitance value VC1 of the variable capacitance capacitor 31 to the calculated capacitance value. Accordingly, the reflection coefficient $\Gamma$ is positioned on the matching point (where the reflection coefficient $\Gamma$ is zero) by the capacitance setting unit 23.

The information on a circle determined by the transmission line 35 has been previously stored in the storage unit 25. As described above, the information on a circle (position and size) is determined based on the condition of the transmission line 35, i.e., the characteristic impedance $Z_L$ and the line length L of the transmission line 35. For example, when the transmission line 35 is short enough to be ignored, a circle R1 shown in FIG. 3 to be described later is drawn. When the transmission line 35 has a characteristic impedance of 50Ω and a line length of λ/4, a circle R2 shown in FIG. 4 or a circle R3 shown in FIG. 5 which will be described later is drawn.

Hereinafter, the principle of the matching algorithm of the present embodiment will be described. At a certain plasma load, when the impedance between the RF generator 2 and the plasma processing apparatus 3 is matched (i.e., when the reflection coefficient F is zero), the values of VC1 and VC2 are set to X and Y, respectively. For better understanding, a trace of the input impedance of the matching circuit 30, i.e., the trace of the reflection coefficient $\Gamma$, in the case of changing the value of VC1 from the matching condition in which VC1 is X and VC2 is Y, is shown on the Smith chart of FIG. 3. In this case, the transmission line 35 is short enough to be ignored compared to the wavelength λ of the travelling wave and the reflected wave.

Figure 3:
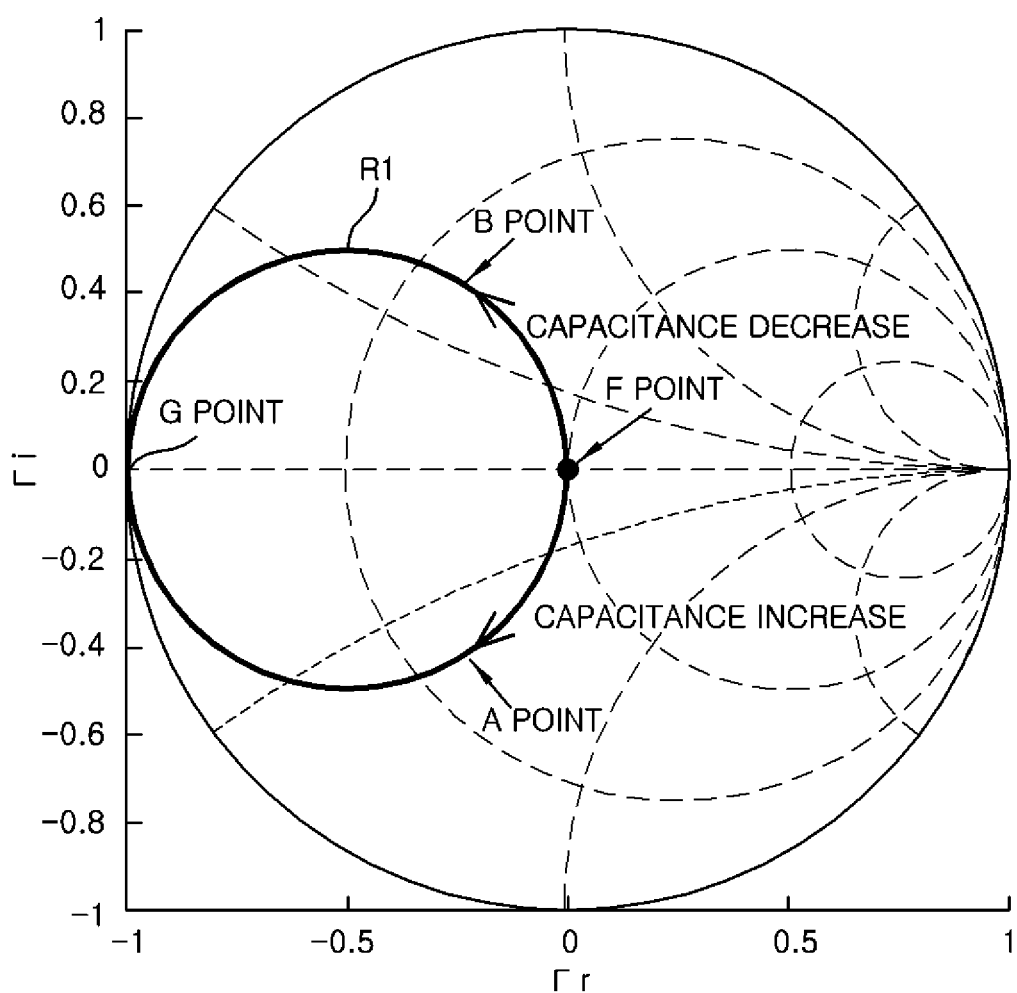
FIG. 3 explains an example of a reflection coefficient trace in the case of changing a capacitance of a variable capacitance capacitor.

In FIG. 3, when VC1 is changed, the trace of the reflection coefficient $\Gamma$ describes the circle R1 having as a diameter a segment connecting G point and F point where the matching is realized. The reflection coefficient $\Gamma$ at the F point has an imaginary part ($\Gamma$i) of zero and a real part ($\Gamma$i) of zero (the input impedance of the matching device 10 is 50Ω). The reflection coefficient $\Gamma$ at the G point has an imaginary part of zero and a real part of −1.

Specifically, in FIG. 3, when the value of VC1 is increased in a state where the matching is realized (F point), the reflection coefficient $\Gamma$ moves on the circle R1 from the F point toward A point. When the value of VC1 is decreased, the reflection coefficient Γ moves on the circle R1 from the F point toward B point. This is known as an impedance trace obtained when the variable capacitance capacitor 31 is connected to the ground (grounded) in the π-type matching circuit 30 shown in FIG. 2 which includes the variable capacitance capacitors 31 and 32 and the inductance 33. Therefore, detailed description thereof will be omitted.

Figure 4:
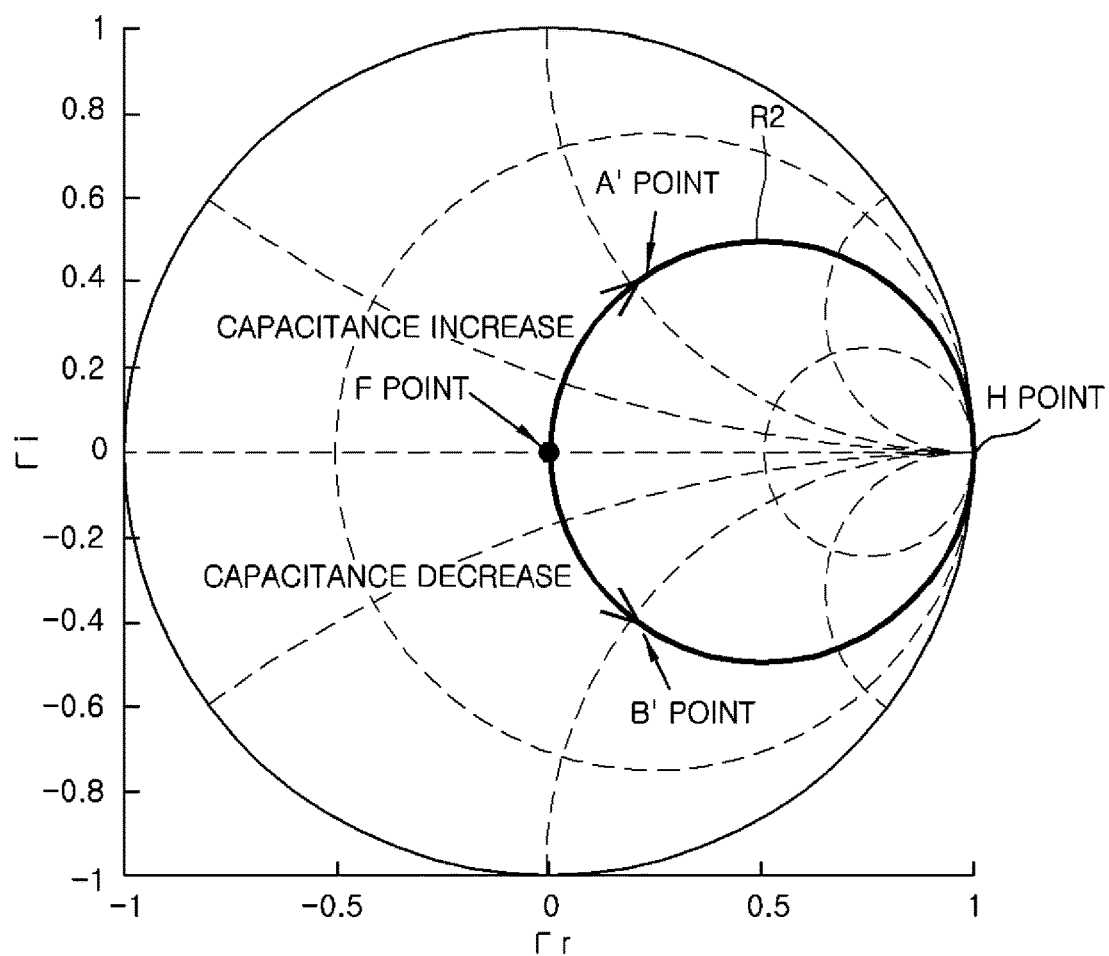
FIG. 4 explains another example of the reflection coefficient trace in the case of changing a capacitance of a variable capacitance capacitor.

FIG. 3 shows the case in which the transmission line 35 may be ignored. However, the transmission line 35 may not be ignored actually. FIG. 4 shows a trace of the reflection coefficient Γ on the Smith chart which is obtained when the transmission line 35 has a characteristic impedance of 50Ω and a line length of λ/4. In FIG. 4, the trace of the reflection coefficient Γ draws a circle R2 having as a diameter a segment connecting H point and the F point where the matching is realized. The reflection coefficient Γ at the H point has an imaginary part of zero and a real part of 1 (the input impedance of the matching device 10 is infinite).

Figure 2:
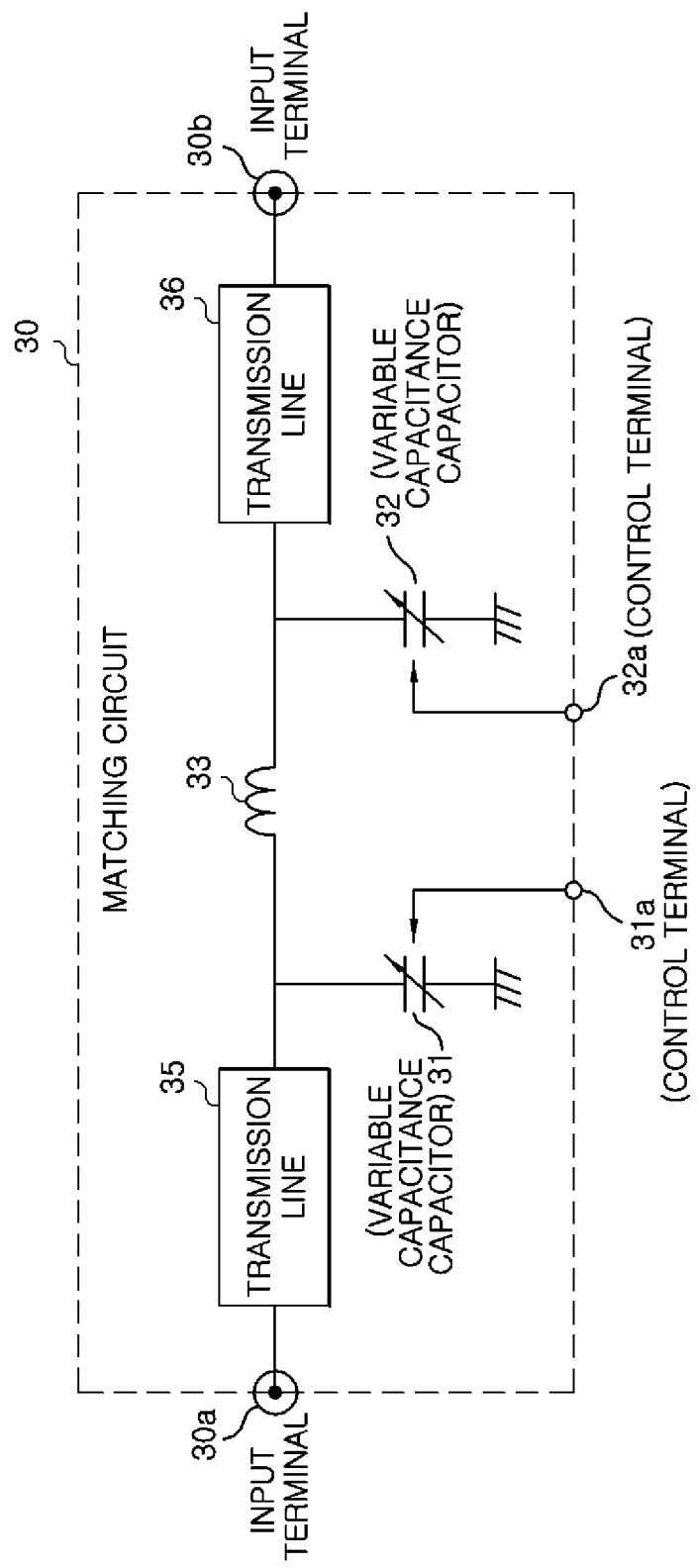
FIG. 2 is a block diagram of a matching circuit according to the first embodiment.

In the matching circuit 30 of FIG. 2, it is assumed that an input impedance seen from the right end of the transmission line 35 is $Z_1$ and an input impedance seen from the left end of the transmission line 35 is $Z_2$. $Z_2$ is determined by the following Eq. (4). In the following Eq. (4), $Z_1$ indicates an input impedance in the case where the transmission line 35 may be ignored (FIG. 3) and $Z_2$ indicates an input impedance in the case where the transmission line 35 may not be ignored (FIG. 4). When the transmission line 35 may not be ignored (FIG. 4), the circle R1 shown in FIG. 3 is changed to the circle R2 shown in FIG. 4.

$$Z_2 = Z_L \frac{Z_1 + jZ_L \tan\left(\frac{2\pi}{\lambda}L\right)}{Z_L + jZ_1 \tan\left(\frac{2\pi}{\lambda}L\right)} \quad \text{Eq. (4)}$$

In the case of inserting the transmission line 35 having a characteristic impedance of 50Ω and a line length of λ/4, the trace shown in FIG. 3 is changed to the trace shown in FIG. 4 by 180° rotation about the point (F point) where the real part and the imaginary part of the reflection coefficient Γ are zero. Therefore, in FIG. 4, when the value of VC1 is increased in a state where the matching is realized (F point), the reflection coefficient Γ moves on the circle R2 toward A' point (direction in which the imaginary part of the reflection coefficient Γ is positive). When the value of VC1 is decreased, the reflection coefficient Γ moves on the circle R2 toward B' point (direction in which the imaginary part of the reflection coefficient Γ is negative). In other words, on the circle R2 shown in FIG. 4, when the imaginary part of the reflection coefficient Γ is positive, VC1 is greater than the matching value X, whereas when the imaginary part of the reflection coefficient Γ is negative, VC1 is smaller than the matching value X.

In FIG. 4, when VC1 is increased or decreased at the matching point (F point), the reflection coefficient Γ follows the trace of the circle R2. This indicates that the reflection coefficient Γ moves on the circle R2 shown in FIG. 4 when VC1 is changed in a state where VC2 is set to the matching value. Therefore, it is preferable to control VC2 such that the reflection coefficient Γ is positioned on the circle R2 shown in FIG. 4 and then control VC1 such that the reflection coefficient Γ becomes zero.

Figure 5:
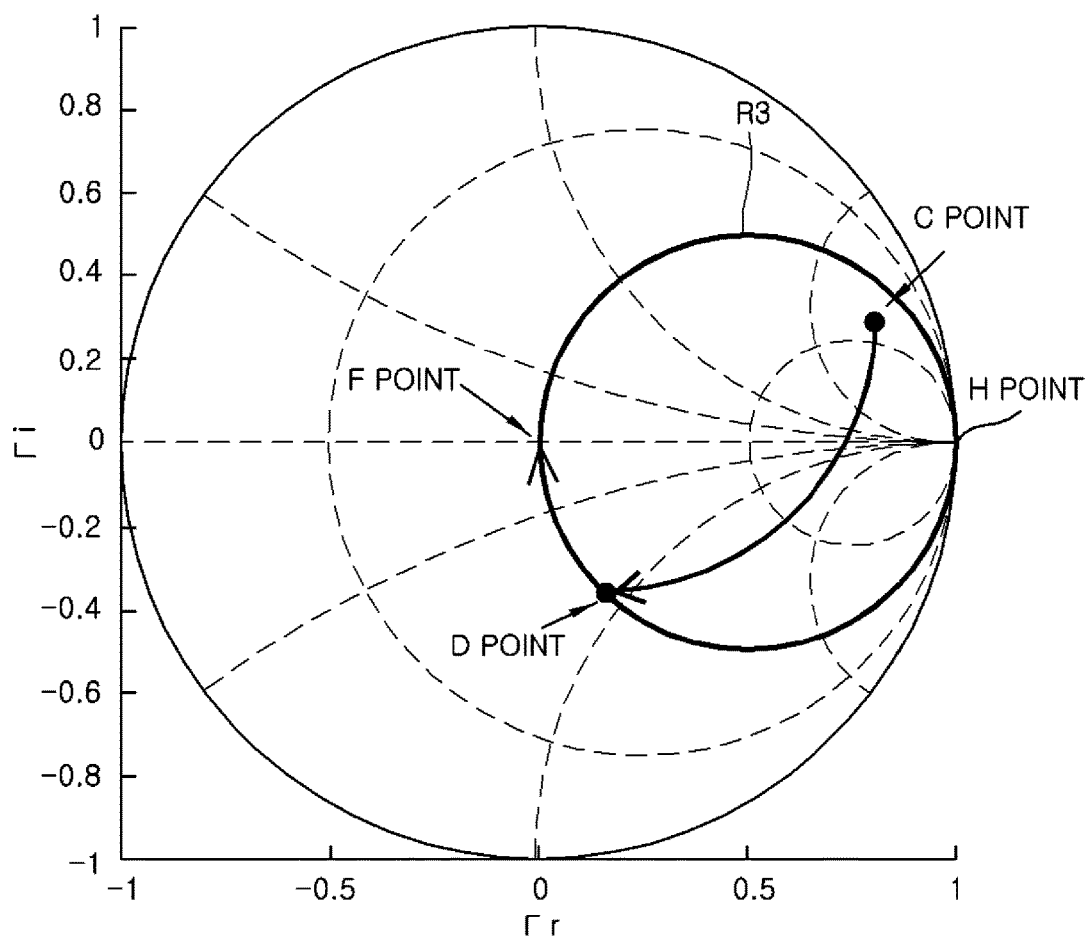
FIG. 5 shows a reflection coefficient trace according to the first embodiment.

FIG. 5 shows a trace of the reflection coefficient Γ on the Smith chart in the case of performing the impedance matching according to the embodiment by the matching circuit 30 under the condition that the transmission line 35 has a characteristic impedance of 50Ω and a line length of λ/4 as in the case shown in FIG. 4. C point is the reflection coefficient Γ, i.e., the input impedance of the matching device 10, at the time when VC1 and VC2 are initial values (e.g., minimum value of the variable capacitance capacitor), in the case where the plasma load has a certain input impedance.

First, the control unit 20 increases only VC2 until the reflection coefficient Γ reaches from the C point where VC1 and VC2 are the initial values to D point on the circle R3. The circle R3 is the same as the circle R2 shown in FIG. 4. The information on the circle R3 is stored in the storage unit 25. When the reflection coefficient Γ reaches the D point on the circle R3, VC2 becomes a matching capacitance Y. In that state, VC2 is controlled to the matching value, whereas VC1 remains at the initial value. Therefore, the control unit 20 gradually increases VC1. When VC1 is increased, the reflection coefficient Γ moves on the circle R3 as described above. Accordingly, it is preferable to stop the increase of VC1 when the reflection coefficient Γ becomes zero. At this time, VC1 becomes a matching capacitance X.

The trace shown in FIG. 5 is an example of the case in which an input impedance of the plasma load is a certain value. When the input impedance of the plasma load is changed, the positions of the C point and the D point are changed. However, when VC2 is the matching capacitance, the reflection coefficient Γ is positioned on the circle R3.

In the case of the C point shown in FIG. 5, a minimum value of the variable capacitance capacitor is selected as the initial values of VC1 and VC2. However, a maximum value of the variable capacitance capacitor or another value may be selected. In that case, the position of the C point is changed. However, regardless of the initial values of VC1 and VC2, when VC1 is changed in a state where VC2 is the matching capacitance, the reflection coefficient Γ moves on the circle R3.

Therefore, the control unit 20 controls only VC2 until the reflection coefficient Γ is positioned on the circle R3 and then controls only VC1 after the reflection coefficient Γ is positioned on the circle R3. In the control of VC2, the reflection coefficient Γ is outside the circle R3 if VC2 is greater than the matching value Y and, thus, VC2 is decreased so that the reflection coefficient Γ is positioned on the circle R3. On the contrary, the reflection coefficient Γ is inside the circle R3 if VC2 is smaller than the matching value Y and, thus, VC2 is increased so that the reflection coefficient Γ is positioned on the circle R3.

After VC2 is controlled so that the reflection coefficient Γ is positioned on the circle R3, VC1 is controlled in the following manner. Specifically, when the imaginary part of the reflection coefficient Γ is positive, VC1 is greater than the matching value X and, thus, VC1 is decreased so that the reflection coefficient Γ becomes zero. On the contrary, when the imaginary part of the reflection coefficient Γ is negative, VC1 is smaller than the matching value X and, thus, VC1 is increased so that the reflection coefficient Γ becomes zero.

Even when the input impedance of the plasma load is changed during the control of VC1 and VC2, VC2 and VC1 are controlled as described above. In other words, VC2 is controlled so that the reflection coefficient Γ is positioned on the circle R3 and, then, VC1 is controlled.

FIGS. 4 and 5 show as an example the case in which the transmission line 35 has a characteristic impedance of 50Ω and a line length of λ/4 in the matching circuit 30 of FIG. 2. However, the present invention is not limited thereto. If the condition of the transmission line 35 is different from the above condition, the trace of the circle in the case of changing VC1 under the condition in which VC2 is the matching capacitance is different from the trace of the circle R3 shown in FIGS. 4 and 5. Therefore, the trace of the circle which satisfies the condition of the transmission line 35 may be set by the above-described Eq. (4).

Figure 6:
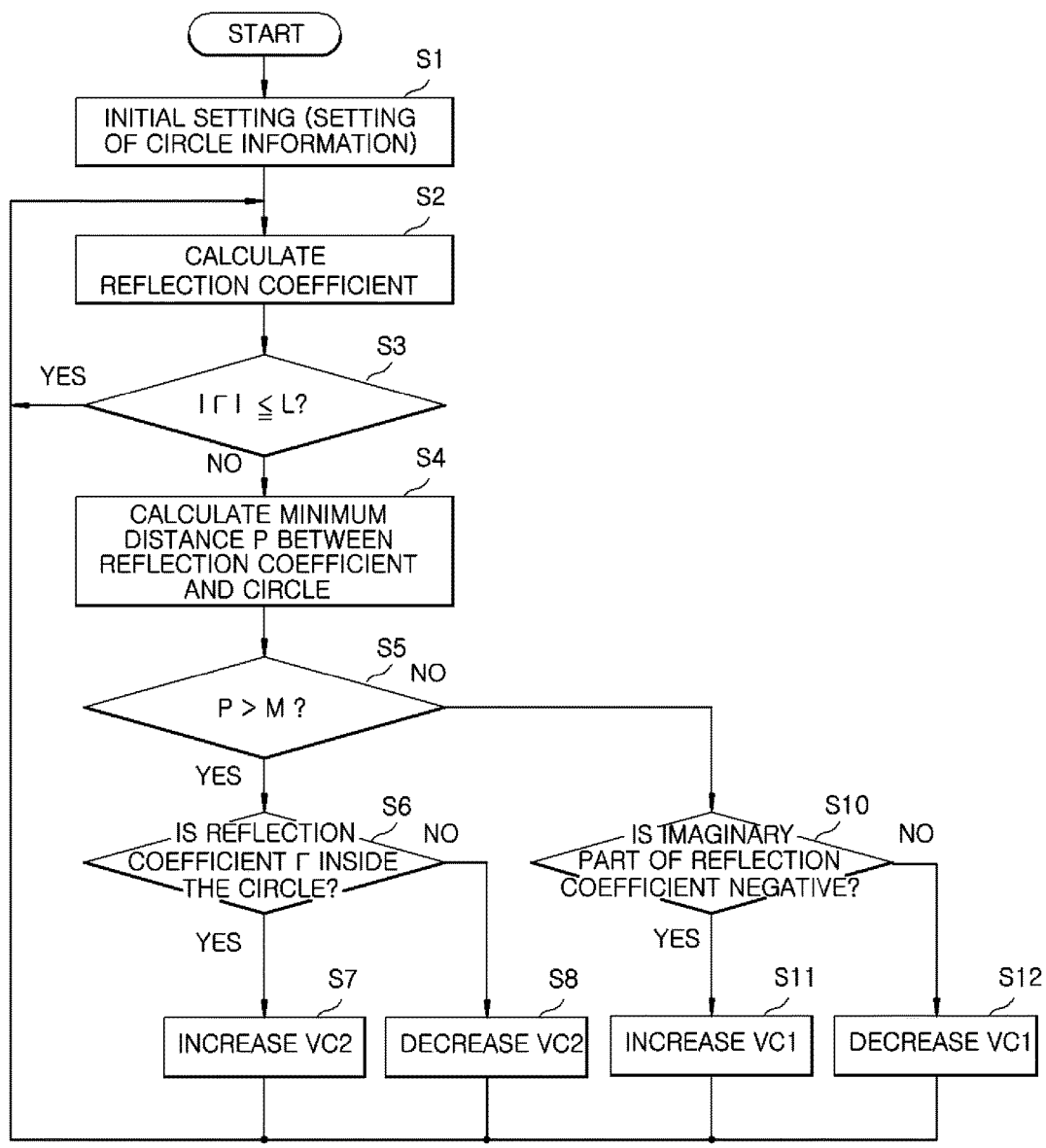
FIG. 6 is a flowchart of an impedance matching process according to the first embodiment.

FIG. 6 is a flowchart of an impedance matching process according to the first embodiment. This process is performed by the control unit 20. First, as initial setting, the information on the circle shown in FIGS. 4 and 5 (size and position on the Smith chart) is stored in the storage unit 25 (step S1 of FIG. 6). Since the information on the circle is determined depending on the transmission line 35 as described above, the information corresponding to the matching circuit 30 is required. In the step S1, the initial values of VC1 and VC2 are also set.

Next, the reflection coefficient Γ at that time is calculated from the travelling wave Pf and the reflected wave Pr detected by the directional coupler 11 (step S2). Then, an absolute value of the reflection coefficient Γ and a predetermined value L are compared (step S3). When the absolute value of the reflection coefficient Γ is smaller than or equal to L (Yes in step S3), the process returns to the step S2 to obtain the travelling wave Pf and the reflected wave Pr from the directional coupler 11 and calculate again the reflection coefficient Γ at that time.

When the absolute value of the reflection coefficient Γ is greater than L (No in step S3), the process proceeds to a step S4. The predetermined value L is a threshold value for determining whether or not the matching is realized. The predetermined value L is ideally zero. However, a certain threshold value L is used because it is actually difficult to make the reflection coefficient Γ zero. The predetermined value L is determined by a reflection-resistant power of the RF generator 2 and specifications of the plasma processing apparatus 1 using the RF generator 2.

In the step S4, in order to determine whether or not the reflection coefficient Γ is positioned on the circle defined by the initial setting (step S1), the information on the circle is acquired from the storage unit 25 and a minimum value P of the distance between the reflection coefficient Γ and the circle is calculated. When the value P is greater than a predetermined threshold value M (Yes in step S5), VC2 is not the matching value and thus is controlled to be changed. Specifically, it is determined that the reflection coefficient Γ is not positioned on the circle and the process proceeds to a step S6. The predetermined threshold value M is ideally zero. Since, however, it is actually difficult to set the predetermined threshold value M to zero, the predetermined threshold value M is set to a certain value.

When the minimum value P is smaller than or equal to the predetermined threshold value M (No in step S5), VC2 is the matching value and there is no need to change VC2. Therefore, the process proceeds to an operation of controlling VC1 (i.e., the capacitance of the variable capacitance capacitor 31). In other words, it is determined that the reflection coefficient Γ is positioned on the circle and the process proceeds to a step S10.

In the step S6, it is determined whether or not the reflection coefficient Γ is inside the circle to decide whether to increase or decrease VC2 (i.e., the capacitance of the variable capacitance capacitor 32). When the reflection coefficient Γ is inside the circle (Yes in the step S6), VC2 is smaller than Y and thus is increased (step S7). When the reflection coefficient Γ is outside the circle (No in step S6), VC2 is greater than Y and thus is decreased (step S8). The amount of increase and decrease may be set in advance.

By repeating the processes from the step S2 to the step S7 or S8, the minimum value P can be smaller than or equal to the predetermined threshold value M. In other words, the reflection coefficient Γ can be positioned substantially on the circle. When it is determined in the step S5 that the minimum value P is smaller than or equal to the predetermined threshold value M, the process proceeds to the step S10 to perform the operation of controlling VC1 (i.e., the capacitance of the variable capacitance capacitor 31).

In the step S10, it is determined whether or not the imaginary part of the reflection coefficient Γ is negative. In other words, it is determined whether or not VC1 is smaller than X. As described above, when the imaginary part of the reflection coefficient Γ is negative, VC1 is smaller than X. When the imaginary part of the reflection coefficient Γ is positive, VC1 is greater than X. Therefore, when the imaginary part of the reflection coefficient Γ is negative (Yes in step S10), VC1 is increased. When the imaginary part of the reflection coefficient Γ is positive (No in step S10), VC1 is decreased. By changing VC1 in the above manner, the reflection coefficient Γ becomes close to zero. The amount of increase and decrease may be set in advance.

As described above, the control unit 20 calculates the reflection coefficient based on the travelling wave and the reflected wave detected by the directional coupler 11. When the distance between the calculated reflection coefficient and the circle described by the trace of the reflection coefficient which passes through the matching point on the Smith chart is greater than a predetermined value, the control unit 20 changes the capacitance value of the second variable capacitance capacitor 32 and the calculated reflection coefficient to make the distance equal to or less than the predetermined value. When the distance becomes equal to or less than the predetermined value, the control unit 20 changes the capacitance value of the first variable capacitance capacitor 31 and makes the calculated reflection coefficient smaller without changing the distance.

The present embodiment has at least the following effects. (a) When the distance between the calculated reflection coefficient and the circle described by the trace of the reflection coefficient which passes through the matching point on the Smith chart is greater than the predetermined value, the capacitance value of the second variable capacitance capacitor is changed and the calculated reflection coefficient is changed to make the distance equal to or less than the predetermined value. When the distance becomes equal to or less than the predetermined value, the capacitance value of the first variable capacitance capacitor is changed and the calculated reflection coefficient is decreased. Accordingly, the matching algorithm of the present invention can converge on the matching point regardless of the load impedance.

(Characteristics of Circle Matching)

Figure 8A:
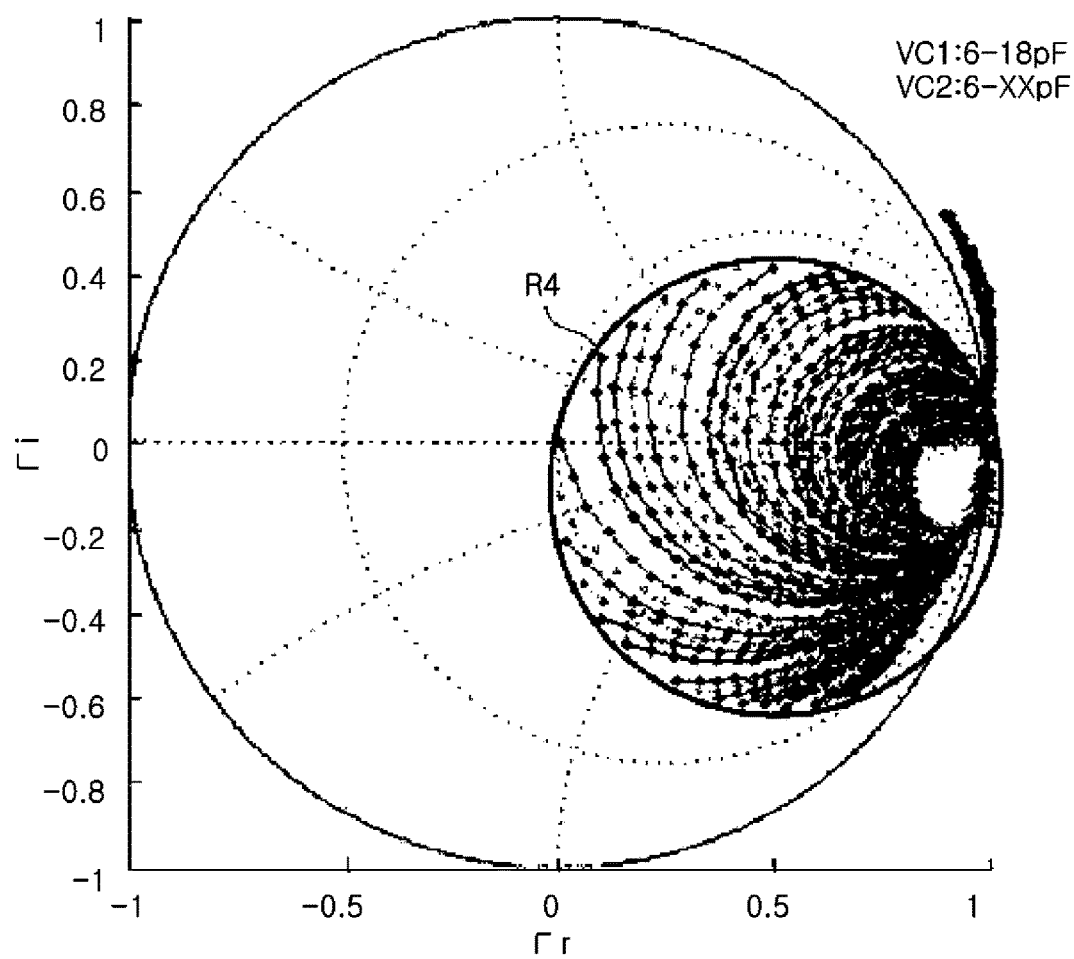
FIGS. 8A to 8C explain circle matching.
Figure 8B:
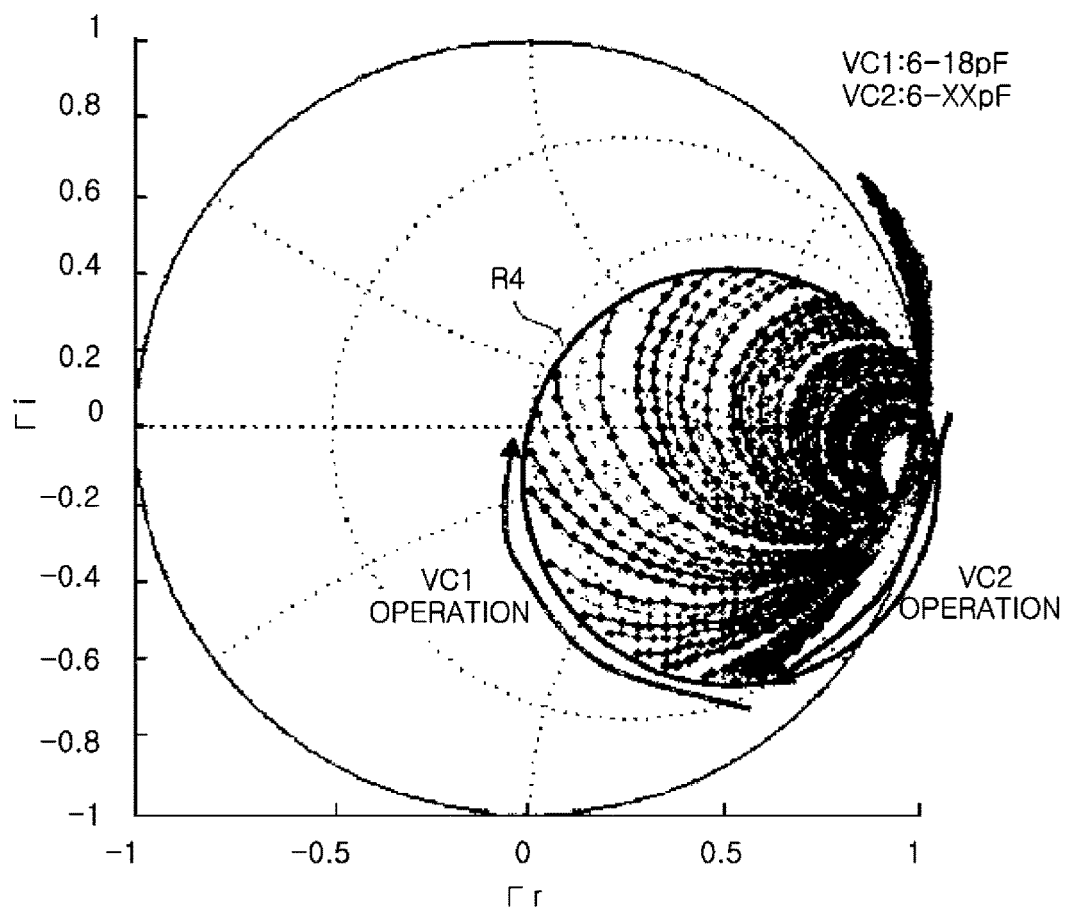
Figure 8C:
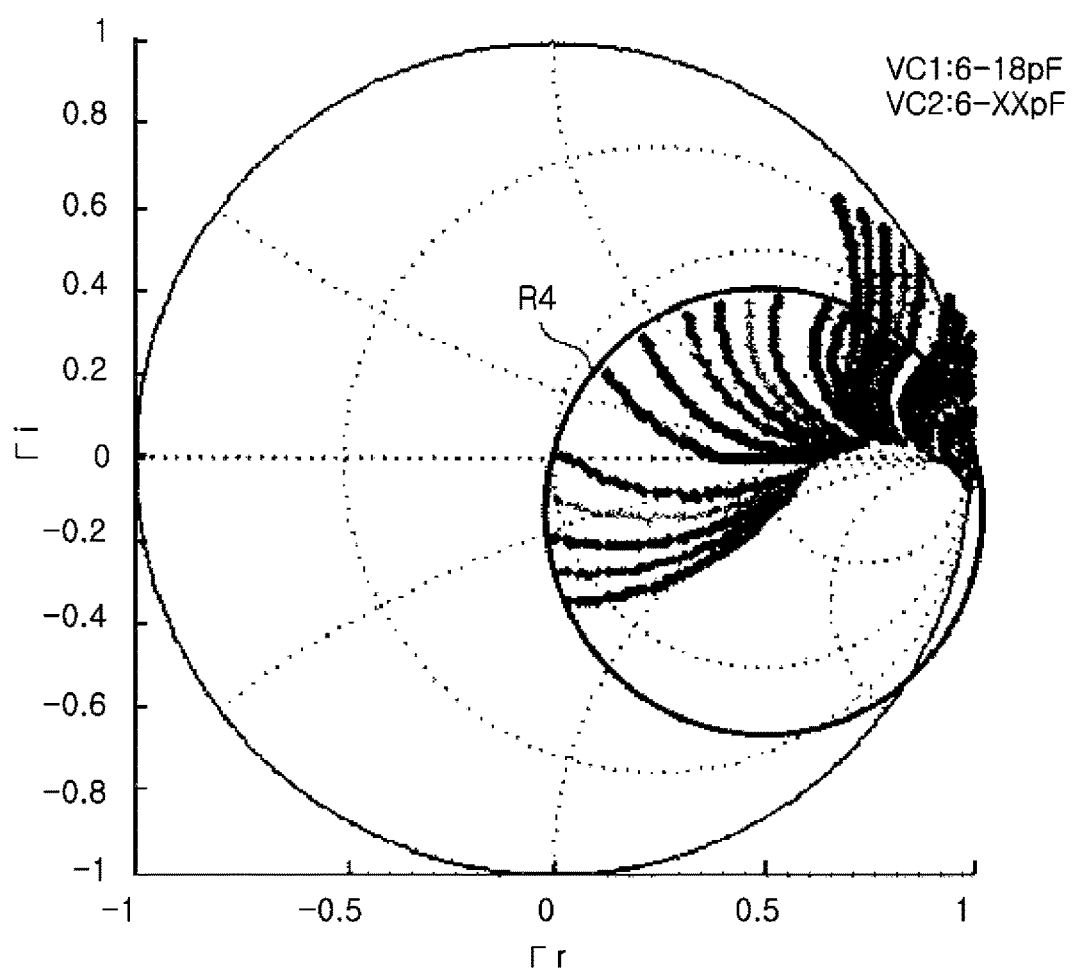

In the impedance matching according to the first embodiment, the trace of VC1 (trace of the reflection coefficient Γ in the case of controlling VC1) which passes through the matching point ((U, V)=(0, 0)) and the control (operation) of VC2 at each load have the same regularity. Here, U indicates a real part of the reflection coefficient Γ and V indicates an imaginary part of the reflection coefficient Γ. In other words, when only VC2 is controlled regardless of the load, the movement toward the matching point (U, V)=(0, 0) occurs by switching the control of VC2 to the control (operation) of VC1 on a specific circumference (which is referred to as circle matching). FIGS. 8A to 8C show graphs in which a plurality of fixed values of VC1 is plotted while varying VC2. The graphs shown in FIGS. 8A to 8C were obtained for different loads. Under any load condition, as long as the positioning on the circle R4 (on the circumference) is realized by varying VC2, the matching to (U, V)=(0, 0) can be realized by varying VC1. However, the basic operation of the circle matching may cause the following problems.

(1) When the load and the plasma have the same movement, hunting in which the reflection coefficient is positioned on or deviated from the circumference occurs in switching VC1 and VC2.

(2) When the reflection coefficient is positioned on the circumference in the case of controlling VC2 only, an operation of positioning on the circumference while moving to a position far from the matching point (target point) and returning to the target point occurs depending on the load impedance. This operation is meaningless in terms of operation and time and deteriorates the impedance. Thus, when plasma ignition occurs during the matching, misfire of the plasma may occur.

(3) Next, in the control of VC1 toward the target point on the circumference, the circle R4 may not be a complete circle depending on a load condition. When only VC1 is controlled, the deviation from the circumference occurs and, thus, an operation of returning to the circumference by controlling VC2 needs to be repeated.

Second Embodiment

Figure 9:
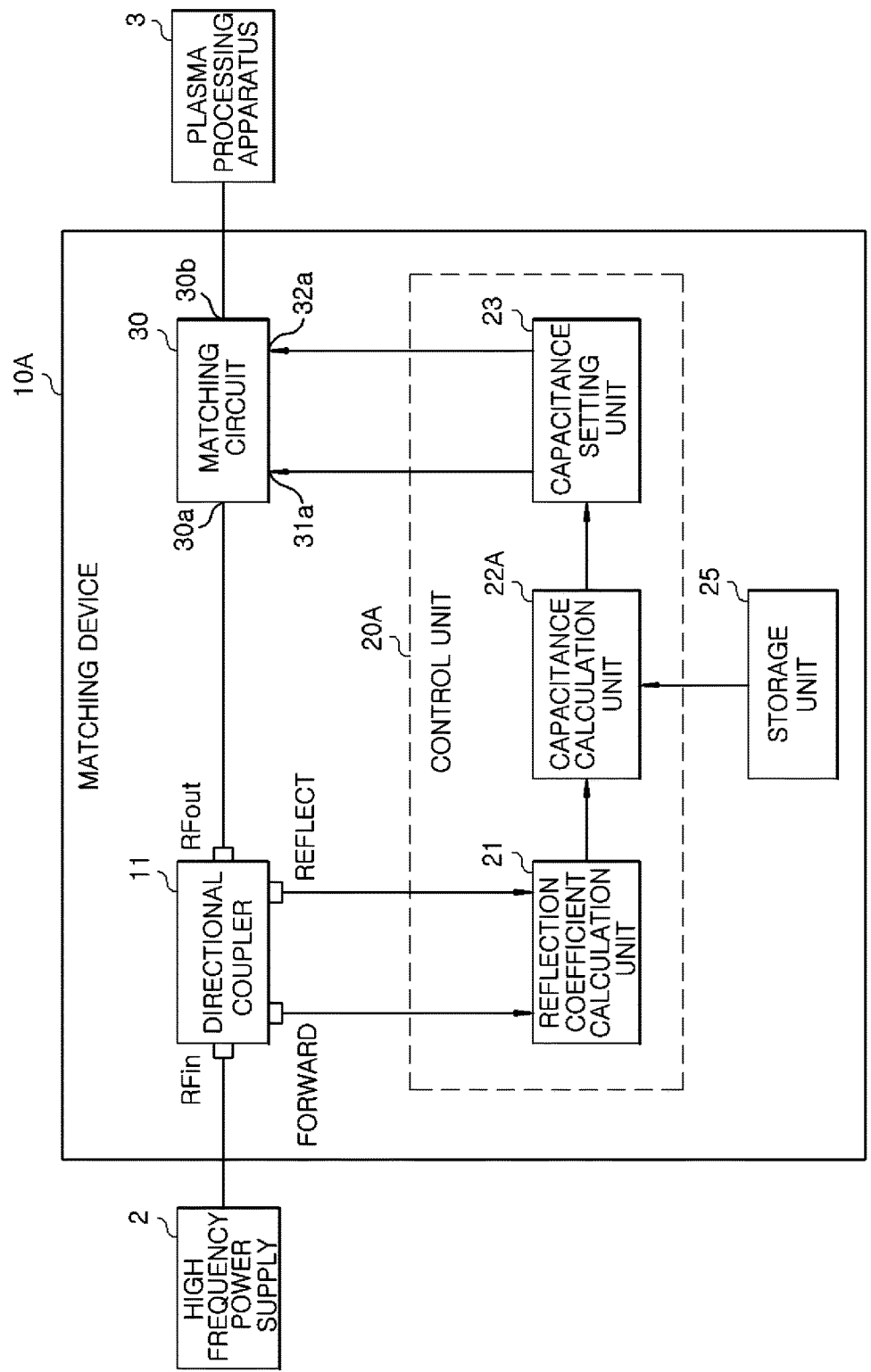
FIG. 9 is a block diagram of a matching device according to a second embodiment.

A matching device according to a second embodiment provides a technique for adapting circle matching to a dynamic load as a solution to the above drawbacks (1) to (3). A configuration of the matching device according to the second embodiment will be described with reference to FIG. 9. A matching device 10A according to the second embodiment is different from the matching device 10 of the first embodiment in the processing of the capacitance calculation unit 22, i.e., the control of the capacitance VC1 of the variable capacitance capacitor 31 of the matching circuit 30 and the capacitance VC2 of the variable capacitance capacitor 32 of the matching circuit 30. The other configurations of the matching device 10A of the second embodiment are the same as those of the matching device 10 of the first embodiment. In other words, the capacitance calculation unit 22A of the matching device 10A of the second embodiment has following features in addition to the features of the capacitance calculation unit 22 of the first embodiment.

(1) A circle in circle matching is specified and a hysteresis is provided at IN/OUT of a circumference region to prevent hunting.

(2) There is provided a function of gradually making VC1 close to the matching point (target point) by fine-tuning VC1 during the matching of VC2 (movement toward the circumference) so that the matching can be performed quickly while preventing deterioration of the impedance in a transition state of the matching under any load condition. Therefore, the VC2 control is predictive control for calculating an intersection point with the circle (circumference), not a simple operation of determining a direction. VC2 and VC1 are controlled by determining the direction of fine-tuning of VC1 based on the intersection point with the circumference (expected point on circumference) which is predicted by the predictive control.

(3) The matching by VC1 (movement toward the target point on the circumference) and the fine-tuning of VC2 are performed at the same time to prevent deviation from the circumference region. The direction of the fine-tuning of VC2 is a decreased direction in the case of outward deviation from the circle and an increased direction in the case of inward deviation from the circle.

Figure 10:
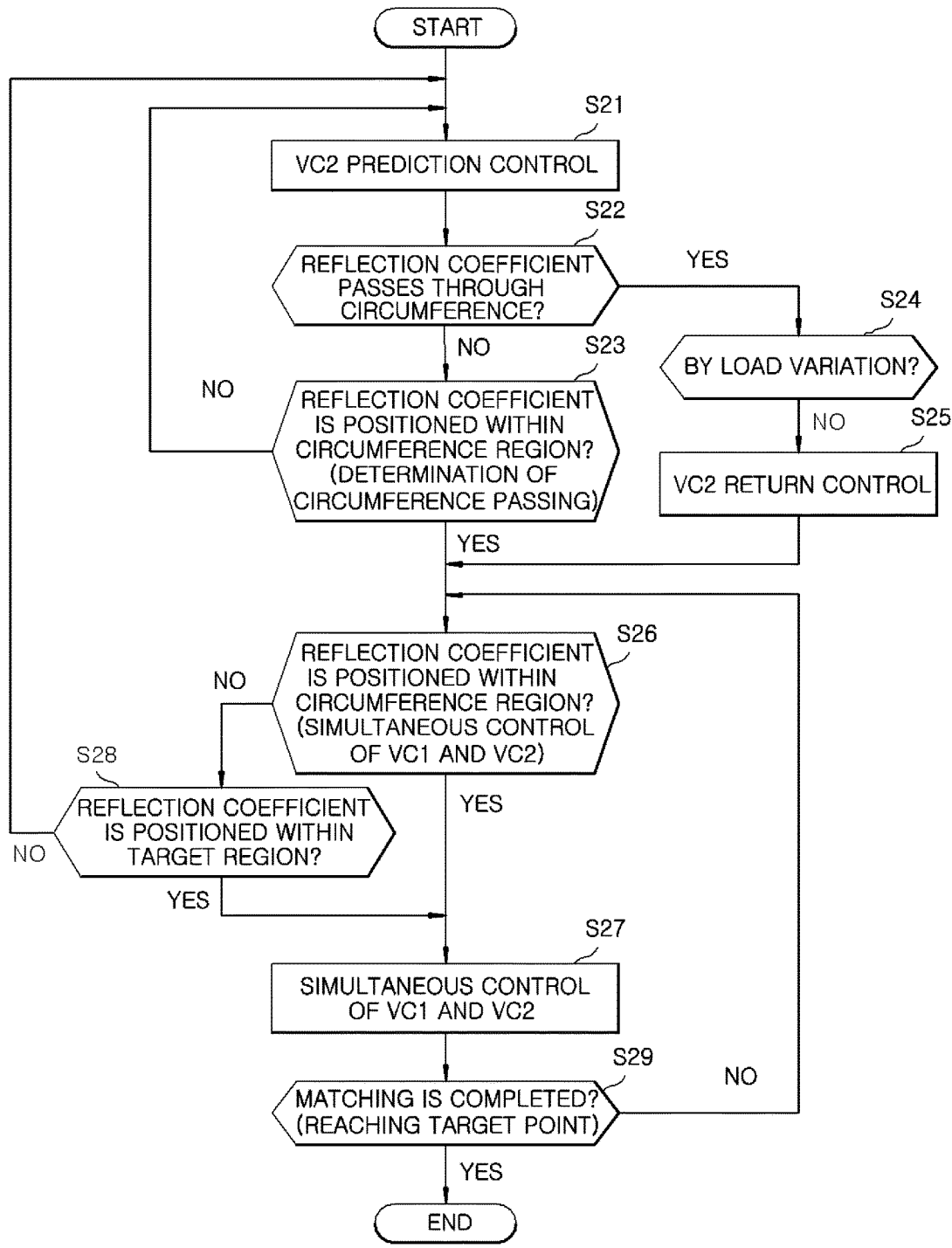
FIG. 10 is a flowchart of an impedance matching process according to the second embodiment.
Figure 11:
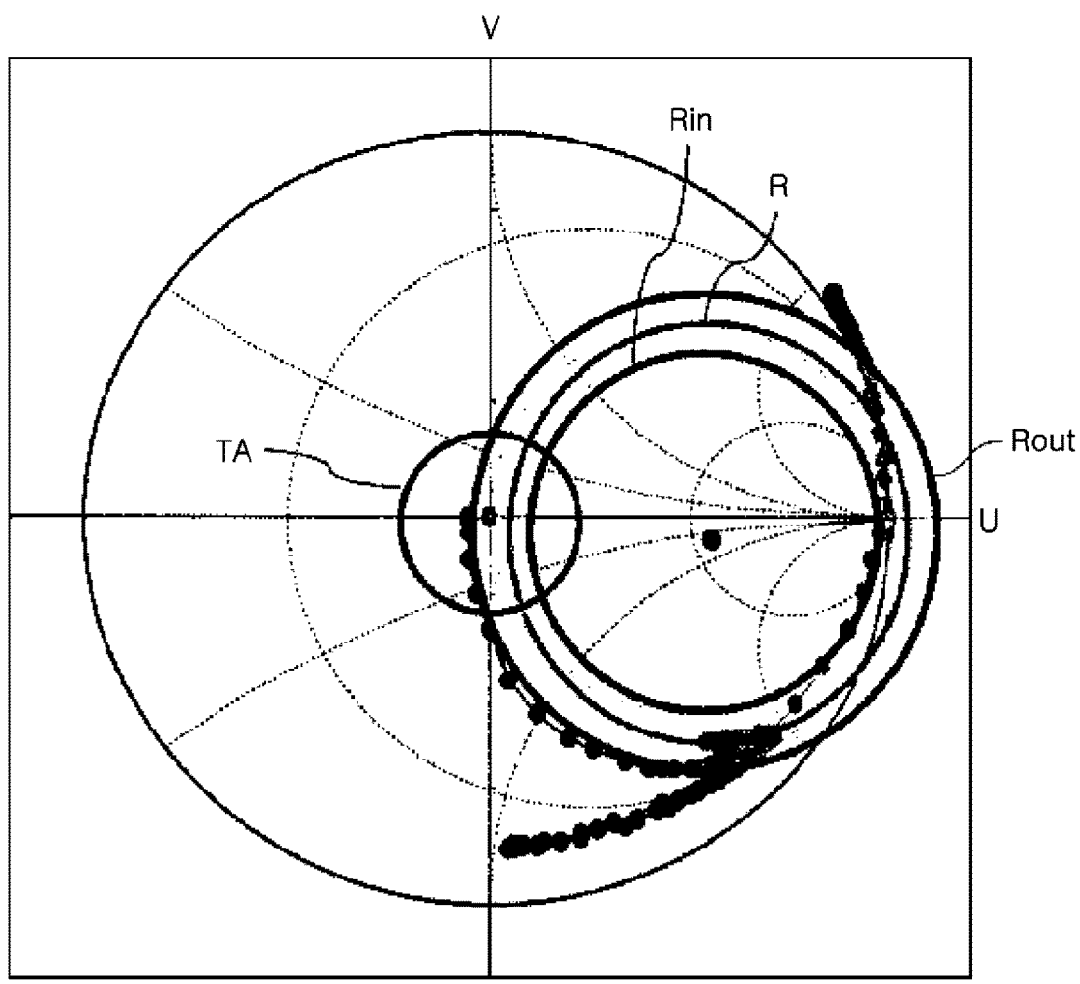
FIG. 11 shows a reflection coefficient trace according to the second embodiment.

An impedance matching process according to the second embodiment will be described with reference to FIGS. 10 and 11. FIG. 10 is a flowchart of the impedance matching process according to the second embodiment. FIG. 11 shows a trace of a reflection coefficient according to the second embodiment. The impedance matching process shown in FIG. 10 is performed by the capacitance calculation unit 22A. Hereinafter, the respective steps will be described.

(1) VC2 Prediction Control (Step S21)

When the plasma load has a certain input impedance, VC2 is changed such that VC2 goes to a circle R from the reflection coefficient $\Gamma$, i.e., the input impedance of the matching device 10, at the time when VC1 and VC2 are initial values. At this time, an intersection point with the circle R is predicted by calculation and a direction of fine-tuning of VC1 is determined based on the predicted intersection point. Then, VC1 is fine-tuned in the determined direction. When a V coordinate of the predicted intersection point is negative, VC1 is fine-tuned to be increased. When the V coordinate of the predicted intersection point is positive, VC1 is fine-tuned to be decreased.

(2) Determining Whether or not the Reflection Coefficient Passes Through the Circumference (Step S22)

It is determined whether or not the reflection coefficient $\Gamma$ passes through the circle R. When the reflection coefficient $\Gamma$ does not pass through the circle R (No), the process proceeds to a step S23. When the reflection coefficient $\Gamma$ passes through the circle R (Yes), the process proceeds to a step S24.

(3) Determining Whether or not the Reflection Coefficient is Positioned within the Circumference Region (Step S23)

As shown in FIG. 11, the circumference region is a region between a circumference of an inner circle Rin of the circle R and a circumference of an outer circle Rout of the circle R. It is determined whether or not the reflection coefficient $\Gamma$ is positioned within the circumference region (within a predetermined distance from the circle R). When the reflection coefficient $\Gamma$ is positioned within the circumference region (Yes), the process proceeds to a step S26. When the reflection coefficient $\Gamma$ is not positioned within the circumference region (No), the process proceeds to the step S21.

(4) Determining Whether or not the Reflection Coefficient Passes Through the Circumference by Load Variation (Step S24)

The reflection coefficient $\Gamma$ may be changed by the load variation. When considerable deviation from the trace predicted by the VC2 predictive control occurs, it is determined that the reflection coefficient passes through the circumference by the load variation. When it is determined that the reflection coefficient passes through the circumference by the load variation (Yes), the process proceeds to the step S21. When it is not determined that the reflection coefficient passes through the circumference by the load variation (No), the process proceeds to a step S25.

(5) VC2 Return Control (Step S25)

VC2 is returned to a direction of the immediately previous VC2.

(6) Determining Whether or not the Reflection Coefficient is Positioned within the Circumference Region (Step S26)

It is determined whether or not the reflection coefficient $\Gamma$ is positioned within the circumference region. When the reflection coefficient $\Gamma$ is positioned within the circumference region (Yes), the process proceeds to a step S28. When the reflection coefficient Γ is not positioned within the circumference region (No), the process proceeds to a step S27.

(7) Determining Whether or not the Reflection Coefficient is Positioned within a Target Region (Step S27)

As shown in FIG. 11, the target region is close to the matching point and greater than the circumference region near the matching point. It is determined whether or not the reflection coefficient Γ is positioned inside the target region. When the reflection coefficient Γ is positioned within the target region (Yes), the process proceeds to a step S28. When the reflection coefficient Γ is not positioned within the target region (No), the process proceeds to the step S21.

(8) Simultaneous Control of VC1 and VC2 (Step S28)

When the matching is performed by VC1 (movement toward the target point on the circumference), the fine-tuning of VC2 is also performed to prevent the deviation from the circumference region. The direction of the fine-tuning of VC2 may be determined uniquely. Specifically, the direction of the fine-tuning of VC2 is a decreased direction in the case of outward deviation from the circle and an increased direction in the case of inward deviation from the circle.

(9) Determining Whether or not the Matching has been Completed (Step S29)

It is determined whether or not the reflection coefficient Γ has reached the matching point (target point). When the reflection coefficient Γ has reached the target point, the impedance matching is completed. When the reflection coefficient Γ has not reached the target point, the process returns to the step S26.

In accordance with the second embodiment, the operation hunting due to the variation of the load is suppressed and the misfire of the plasma is suppressed by preventing deterioration of the impedance. Accordingly, the matching time can be shortened.

Example 1

Figure 12:
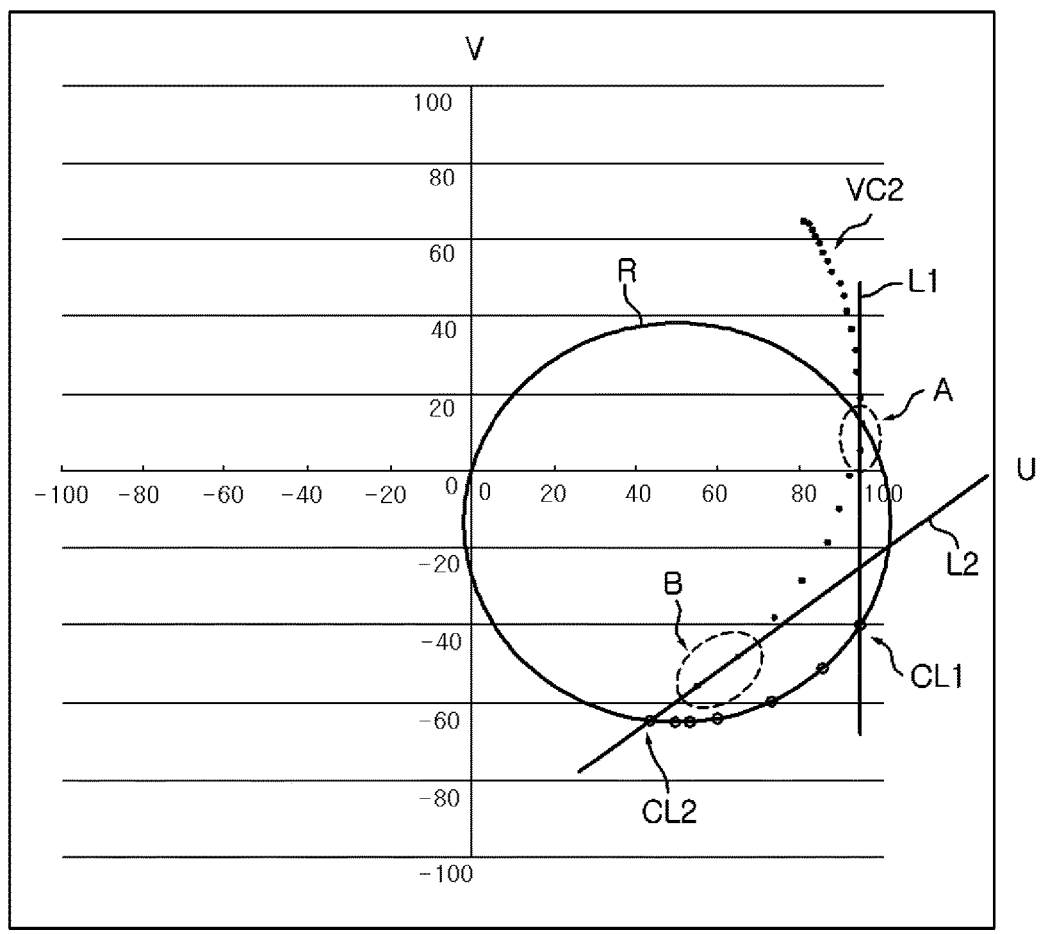
FIG. 12 explains predictive control in a first example of the second embodiment.

A first example (Example 1) of predictive control of VC2 will be described with reference to FIG. 12. FIG. 12 explains predictive control in the Example 1. An intersection point between a circumference and a straight line extending through two points in the control of VC2 on the U, V coordinates is calculated and set to a target point (expected point on circumference). Specifically, as shown in FIG. 12, when two points in the VC2 control are positioned within a dashed ellipse A, an intersection point CL1 between a circumference R and a straight line L1 extending through the two points in the dashed ellipse A is calculated and set to the expected point on circumference. Similarly, when two points in the VC2 control are positioned within a dashed ellipse B, an intersection point CL2 between the circumference R and a straight line L2 extending through the two points in the dashed ellipse B is calculated and set to the expected point on circumference. Since the target value (expected point on circumference passage point) is updated for each calculation, it is possible to deal with the load variation.

Next, the control of VC1 will be described. In the control of VC1, a target point is where the impedance is 50Ω, i.e., (U, V)=(0, 0). The target point is always constant. The distance from the circumference to the matching point (U, V)=(0, 0) can be simply expressed by $U^2+V^2$. Since VC1 basically moves along the circumference, the $U^2+V^2$ is monotonically increased/decreased as VC1 is increased/decreased and there is no plural target points. Therefore, the feedback control for making $U^2+V^2$ close to zero is performed. In the control unit 20A, the control is performed by CPU and, thus, the continuous control cannot be performed. Accordingly, a sampling-type discrete process is performed, so that an operation setting amount is calculated by the following Eq. (5) to simplify the calculation.

Operation amount=$Kp$×deviation(proportional)+$Ki$× accumulation of deviation(integration)+$Kd$× difference from previous deviation(differentiation)

$$MVn = MVn-1 + \Delta MVn$$

$$\Delta MVn(\text{operation amount}) = Kp \times (e_n - e_{n-1}) + Ki \times e_n + Kd \times ((e_n - e_{n-1}) - (e_{n-1} - e_{n-2})) \quad \text{Eq. (5)}$$

Here, MVn and MVn−1 indicate a current operation setting amount and a previous operation setting amount, respectively; ΔMVn indicates a difference from the current operation setting amount; $e_n$, $e_{n-1}$ and $e_{n-2}$ indicate a current deviation, a previous deviation, and a deviation immediately before the previous deviation, respectively; and Kp, Ki and Kd indicate gain in each operation.

The deviation from the target point is a difference of $U^2+V^2$. The actual control is to determine pF to be set for VC1. The calculation of the above Eq. (5) is performed by using $U^2+V^2$. Then, a setting deviation (ΔMVn) is converted to a deviation (ΔVC1) of VC1.

Example 2

When the intersection point between the matching circle and the straight line obtained from the two points is set as the target point as in the Example 1, the actual operation describes a circular arc. Therefore, the calculation far from the final intersection point has a large error. In order to solve the above drawback, in the Example 2, the intersection point of the circle which is obtained from three points, instead of the straight line obtained from two points, is set to the target point. Accordingly, the prediction can become more accurate.

Hereinafter, the calculation of the target point and the calculation of the distance in the Example 2 will be described. The equation of the circle is expressed by the following Eq. (6).

$$(X-a)^2 + (Y-b)^2 = r^2 \quad \text{Eq. (6)}$$

Since there are three variables a, b and r, the equation of the circle can be obtained by substituting the three points in the above Eq. (6).

Figure 13:
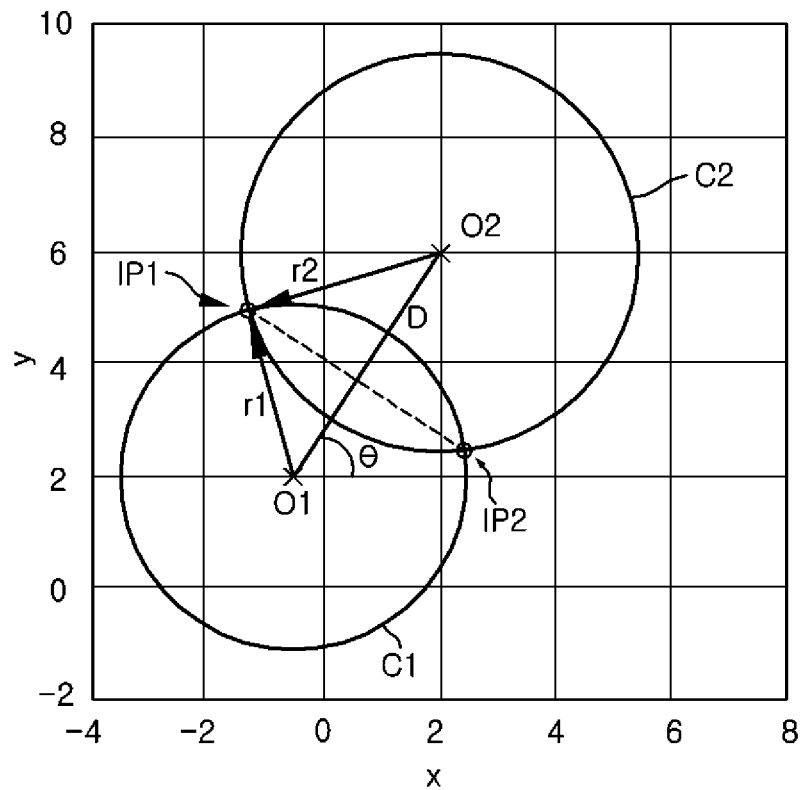
FIGS. 13 to 15 explain predictive control in a second example of the second embodiment.

An intersection point between a matching circle and a trajectory circle of an operation which is predicted from the three points during the matching operation can be obtained in the following manner. As shown in FIG. 13, a circle C1 is expressed by the central coordinate (xc1, yc1) and a radius r1 thereof. A circle C2 is expressed by the central coordinate (xc2, yc2) and a radius r2 thereof. A distance D between the centers and an angle θ are obtained by the following equations.

$$D = \sqrt{((xc2-xc1)^2 + (yc2-yc1)^2)} \quad \text{Eq. (7)}$$

$$\theta = \tan^{-1}((yc2-yc1)/(xc2-xc1)) \quad \text{Eq. (8)}$$

Figure 14:
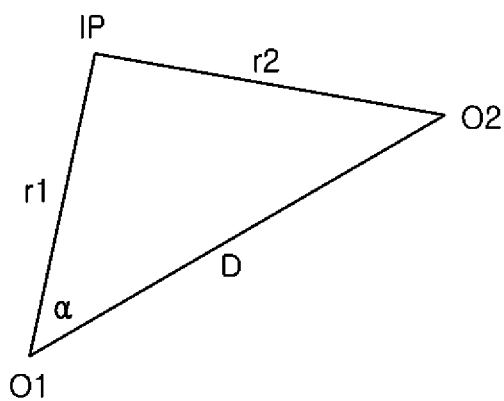

D is obtained by the above Eq. (7), and lengths of three sides D, r1 and r2 of a triangle shown in FIG. 14 are obtained. An angle α is obtained from the lengths of the three sides D, r1 and r2 by using the law of cosines (following Eqs. (9) to (11)).

$$\cos(\alpha)=(D^2+r1^2-r2^2)/(2\cdot D\cdot r1) \quad \text{Eq. (9)}$$

$$c=\cos(\alpha) \quad \text{Eq. (10)}$$

$$\alpha=\cos^{-1}(c)=a\cos(c) \quad \text{Eq. (11)}$$

The intersection point IP1 (xp1, yp1) is spaced from the center C1 (xc1, yc1) by a radius r1 in a direction of angle (θ+α). Therefore, the intersection point IP1 (xp1, yp1) is obtained by the following equations.

$$xp1=xc1+r1\cdot\cos(\theta+\alpha) \quad \text{Eq. (12)}$$

$$yp1=yc1+r1\cdot\sin(\theta+\alpha) \quad \text{Eq. (13)}$$

The intersection point IP2 (xp2, yp2) is spaced from the center C1 (xc1, yc1) by a radius r1 in a direction of angle (θ−α). Similarly, the intersection point IP2 (xp2, yp2) is obtained by the following equations.

$$xp2=xc1+r1\cdot\cos(\theta-\alpha) \quad \text{Eq. (14)}$$

$$yp2=yc1+r1\cdot\sin(\theta-\alpha) \quad \text{Eq. (15)}$$

One of the two intersection points IP1 and IP2 obtained by the above Eqs. (12) to (15) is selected as the target point.

Figure 15:
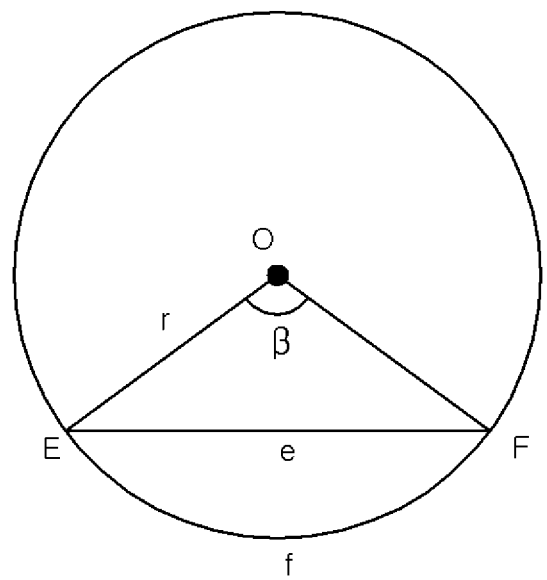

The variable capacitance required for the movement is calculated from a distance between a current position and the target point. At this time, a length of the circular arc is obtained and the prediction can be more accurate compared to the case of the straight line in the Example 1. As shown in FIG. 15, if a radius r of the circle and a central angle β are given, a length e of a chord between an E point and an F point and a length f of the circular arc are obtained by the following Eqs. (16) and (17).

$$e=2\cdot r\cdot\sin(\beta/2) \quad \text{Eq. (16)}$$

$$f=r\cdot\beta \quad \text{Eq. (17)}$$

The distance between the current position and the target point obtained by calculating the intersection point between the two circles becomes the length e of the chord. θ is obtained from the Eq. 16 and the length f of the circular arc is obtained from the Eq. 17.

The present invention is not limited to the above embodiment and may be variously modified without departing from the scope thereof. In the above embodiment, the information on the circle which corresponds to the transmission line 35 is stored in the storage unit 25 in advance. However, the information on the circle may be calculated by the control unit 20, when necessary, by using the above Eq. (4).

The specification includes at least the following configurations of the present invention.

(First Configuration)

A matching device including:

a directional coupler configured to detect a travelling wave and a reflected wave;

a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to one end of the first variable capacitance capacitor and the other end connected to one end of the second variable capacitance capacitor; and a control unit configured to control a capacitance value of the first variable capacitance capacitor and a capacitance value of the second variable capacitance capacitor based on the travelling wave and the reflected wave detected by the directional coupler, wherein the control unit calculates a reflection coefficient based on the travelling wave and the reflected wave detected by the directional coupler, and wherein when a distance between the calculated reflection coefficient and a circle described by a trace of the reflection coefficient which passes through a matching point on a Smith chart is greater than a predetermined value, the control unit changes the capacitance value of the second variable capacitance capacitor and the calculated reflection coefficient to make the distance equal to or less than the predetermined value, and when the distance becomes equal to or less than the predetermined value, the control unit changes the capacitance value of the first variable capacitance capacitor and makes the calculated reflection coefficient smaller.

(Second Configuration)

In the matching device of the first configuration, the control unit increases the capacitance value of the second variable capacitance capacitor when the calculated reflection coefficient is positioned inside the circle and decreases the capacitance value of the second variable capacitance capacitor when the calculated reflection coefficient is positioned outside the circle.

(Third Configuration)

In the matching device of the first or second configuration, the control unit increases the capacitance value of the first variable capacitance capacitor when an imaginary part of the calculated reflection coefficient is negative and decreases the capacitance value of the first variable capacitance capacitor when the imaginary part of the calculated reflection coefficient is positive.

(Fourth Configuration)

In the matching device of the first to third configurations, the first transmission line of the matching circuit has a characteristic impedance of 50Ω and a line length of λ/4 (λ being a wavelength of the travelling wave and the reflected wave) or a line length that is short enough to be ignored compared to the travelling wave and the reflected wave.

(Fifth Configuration)

A matching method in a matching device including a matching circuit having a directional coupler configured to detect a traveling wave and a reflected wave, and a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to one end of the first variable capacitance capacitor and the other end connected to one end of the second variable capacitance capacitor, the method including:

setting a circle described by a trace of a reflection coefficient which passes through a matching point on a Smith charge in accordance with the first transmission line;

calculating the reflection coefficient based on the traveling wave and the reflected wave detected by the directional coupler;

changing, when a distance between the calculated reflection coefficient and the circle is greater than a predetermined value, the capacitance of the second variable capacitance capacitor and the calculated reflection coefficient to make the distance equal to or less than the predetermined value; and changing, when the distance becomes equal to or less than the predetermined value, the capacitance of the first variable capacitance capacitor to make the calculated reflection coefficient close to zero.

(Sixth Configuration)

A matching device including:

a directional coupler configured to detect a travelling wave and a reflected wave;

a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to said one end of the first variable capacitance capacitor and the other end connected to said one end of the second variable capacitance capacitor; and a control unit configured to control a capacitance value of the first variable capacitance capacitor and a capacitance value of the second variable capacitance capacitor based on the travelling wave and the reflected wave detected by the directional coupler, wherein the control unit calculates a reflection coefficient based on the travelling wave and the reflected wave detected by the directional coupler, changes the capacitance of the second variable capacitance capacitor such that the capacitance of the second variable capacitance capacitor goes to a circle described by a trace of the reflection coefficient which passes through a matching point on a Smith chart, calculates and predicts an intersection point with the circle, and determines a direction of fine-tuning of the capacitance of the first variable capacitance capacitor based on the predicted intersection point (expected point on circumference), wherein the control unit fine-tunes the capacitance of the first variable capacitance capacitor such that the capacitance of the first variable capacitance capacitor is increased when an imaginary part of the expected point on circumference is negative and fine-tunes the capacitance of the first variable capacitance capacitor such that the capacitance of the first variable capacitance capacitor is decreased when the imaginary part of the expected point on circumference is positive, the control unit changes the capacitance of the first variable capacitance capacitor such that the calculated reflection coefficient becomes close to zero when a distance between the calculated reflection coefficient and the circle becomes a predetermined value or less, and the control unit fine-tunes the capacitance of the second variable capacitance capacitor such that the capacitance of the second variable capacitance capacitor is decreased in the case of outward deviation from the circle and fine-tunes the capacitance of the second variable capacitance capacitor such that the capacitance of the second variable capacitance capacitor is increased in the case of inward deviation from the circle.

(Seventh Configuration)

In the matching device of the sixth configuration, the expected point on circumference is set by calculating an intersection point between the circle and a straight line extending from two points of the reflection coefficient obtained by changing the capacitance of the second variable capacitance capacitor.

(Eighth Configuration)

In the matching device of the sixth configuration, the expected point on circumference is set by calculating an intersection point between the circle and three points of the reflection coefficient obtained by changing the capacitance of the second variable capacitor.

(Ninth Configuration)

In the matching device of the sixth configuration, the distance smaller than or equal to the predetermined value is a distance between a concentric circle greater than the circle and a concentric circle smaller than the circle.

(Tenth Configuration)

A matching method in a matching device including: a directional coupler configured to detect a travelling wave and a reflected wave; and a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to said one end of the first variable capacitance capacitor and the other end connected to said one end of the second variable capacitance capacitor, the method comprising:

setting a circle described by a trace of a reflection coefficient which passes through a matching point on a Smith chart along the first transmission line;

calculating the reflection coefficient based on a traveling wave and a reflected wave detected by the directional coupler;

changing a capacitance of the second variable capacitance capacitor such that the capacitance of the second variable capacitance capacitor goes to the circle, calculating and predicting an intersection point with the circle, determining a direction of fine-tuning of the capacitance of the first variable capacitance capacitor based on the predicted intersection point (expected point on circumference), fine-tuning the capacitance of the first variable capacitance capacitor such that the capacitance of the first variable capacitance capacitor is increased when an imaginary part of the expected point on circumference is negative, and fine-tuning the capacitance of the first variable capacitance capacitor such that the capacitance of the first variable capacitance capacitor is decreased when the imaginary part of the expected point on circumference is positive; and changing the capacitance of the first variable capacitance capacitor such that the calculated reflection coefficient becomes close to zero when a distance between the calculated reflection coefficient and the circle becomes a predetermined value or less, performing fine-tuning such that the capacitance of the second variable capacitance capacitor is decreased in the case of outward deviation from the circle, and performing fine-tuning such that the capacitance of the second variable capacitance capacitor is increased in the case of inward deviation from the circle.

INDUSTRIAL APPLICABILITY

The present invention can be used for a plasma processing apparatus in a semiconductor manufacturing process for performing etching or thin film formation, other than a RF generator and a matching device for matching an output of the RF generator and a load.

DESCRIPTION OF REFERENCE NUMERALS

2: RF generator
3: plasma processing apparatus 10, 10A: matching device
11: directional coupler
20: control unit
21: reflection coefficient calculation unit
22, 22A: capacitance calculation unit
23: capacitance setting unit
25: storage unit
30: matching circuit
30a: input terminal
30b: output terminal
31, 32: variable capacitance capacitor
31a: control terminal
32a: control terminal
33: inductance
35, 36: transmission line
100: matching device
120: control unit
122: capacitance setting unit

What is claimed is:

1. A matching device comprising:
a directional coupler configured to detect a travelling wave and a reflected wave;
a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to said one end of the first variable capacitance capacitor and the other end connected to said one end of the second variable capacitance capacitor; and
a control unit configured to control a capacitance value of the first variable capacitance capacitor and a capacitance value of the second variable capacitance capacitor based on the travelling wave and the reflected wave detected by the directional coupler,
wherein the control unit calculates a reflection coefficient based on the travelling wave and the reflected wave detected by the directional coupler, changes the capacitance of the second variable capacitance capacitor such that the capacitance of the second variable capacitance capacitor goes to a circle described by a trace of the reflection coefficient which passes through a matching point on a Smith chart, calculates and predicts an intersection point with the circle, and determines a direction of fine-tuning of the capacitance of the first variable capacitance capacitor based on the predicted intersection point (expected point on circumference),
wherein the control unit fine-tunes the capacitance of the first variable capacitance capacitor such that the capacitance of the first variable capacitance capacitor is increased when an imaginary part of the expected point on circumference is negative and fine-tunes the capacitance of the first variable capacitance capacitor such that the capacitance of the first variable capacitance capacitor is decreased when the imaginary part of the expected point on circumference is positive,
the control unit changes the capacitance of the first variable capacitance capacitor such that the calculated reflection coefficient becomes close to zero when a distance between the calculated reflection coefficient and the circle becomes a predetermined value or less, and
the control unit fine-tunes the capacitance of the second variable capacitance capacitor such that the capacitance of the second variable capacitance capacitor is decreased in the case of outward deviation from the circle and fine-tunes the capacitance of the second variable capacitance capacitor such that the capacitance of the second variable capacitance capacitor is increased in the case of inward deviation from the circle.

2. The matching device of claim 1, wherein the expected point on circumference is set by calculating an intersection point between the circle and a straight line extending from two points of the reflection coefficient obtained by changing the capacitance of the second variable capacitance capacitor.

3. The matching device of claim 1, wherein the expected point on circumference is set by calculating an intersection point between the circle and three points of the reflection coefficient obtained by changing the capacitance of the second variable capacitor.

4. The matching device of claim 1, wherein the distance smaller than or equal to the predetermined value is a distance between a concentric circle greater than the circle and a concentric circle smaller than the circle.

5. A matching method in a matching device including: a directional coupler configured to detect a travelling wave and a reflected wave; and a matching circuit including an input terminal, an output terminal, a first variable capacitance capacitor having one end connected to the input terminal through a first transmission line and the other end that is grounded, a second variable capacitance capacitor having one end connected to the output terminal through a second transmission line and the other end that is grounded, and an inductance having one end connected to said one end of the first variable capacitance capacitor and the other end connected to said one end of the second variable capacitance capacitor, the method comprising:
setting a circle described by a trace of a reflection coefficient which passes through a matching point on a Smith chart along the first transmission line;
calculating the reflection coefficient based on a traveling wave and a reflected wave detected by the directional coupler;
changing a capacitance of the second variable capacitance capacitor such that the capacitance of the second variable capacitance capacitor goes to the circle, calculating and predicting an intersection point with the circle, determining a direction of fine-tuning of the capacitance of the first variable capacitance capacitor based on the predicted intersection point (expected point on circumference), fine-tuning the capacitance of the first variable capacitance capacitor such that the capacitance of the first variable capacitance capacitor is increased when an imaginary part of the expected point on circumference is negative, and fine-tuning the capacitance of the first variable capacitance capacitor such that the capacitance of the first variable capacitance capacitor is decreased when the imaginary part of the expected point on circumference is positive; and
changing the capacitance of the first variable capacitance capacitor such that the calculated reflection coefficient becomes close to zero when a distance between the calculated reflection coefficient and the circle becomes a predetermined value or less, performing fine-tuning such that the capacitance of the second variable capacitance capacitor is decreased in the case of outward deviation from the circle, and performing fine-tuning such that the capacitance of the second variable capacitance capacitor is increased in the case of inward deviation from the circle.

* * * * *